United States Patent
Wegener

(10) Patent No.: US 8,005,152 B2
(45) Date of Patent: Aug. 23, 2011

(54) COMPRESSION OF BASEBAND SIGNALS IN BASE TRANSCEIVER SYSTEMS

(75) Inventor: Albert W Wegener, Portola Valley, CA (US)

(73) Assignee: Samplify Systems, Inc., Santa Clara, CA (US)

( * ) Notice: Subject to any disclaimer, the term of this patent is extended or adjusted under 35 U.S.C. 154(b) by 653 days.

(21) Appl. No.: 12/124,382

(22) Filed: May 21, 2008

(65) Prior Publication Data

US 2011/0135013 A1      Jun. 9, 2011

(51) Int. Cl.
*H04B 1/66* (2006.01)

(52) U.S. Cl. ........ 375/241; 375/150; 375/240; 375/256; 375/260; 375/341; 375/340

(58) Field of Classification Search ................... 375/140, 375/150, 256, 260, 341, 340
See application file for complete search history.

(56) References Cited

U.S. PATENT DOCUMENTS

| | | | |
|---|---|---|---|
| 5,999,561 A | 12/1999 | Naden et al. | |
| 6,263,503 B1* | 7/2001 | Margulis | 725/81 |
| 6,449,596 B1* | 9/2002 | Ejima | 704/501 |
| 6,842,623 B2 | 1/2005 | Koscal | |
| 7,009,533 B1 | 3/2006 | Wegener | |
| 7,088,276 B1* | 8/2006 | Wegener | 341/155 |
| 7,835,435 B2 | 11/2010 | Soni et al. | |
| 2003/0100286 A1 | 5/2003 | Severson et al. | |
| 2004/0062392 A1* | 4/2004 | Morton | 380/200 |
| 2005/0104753 A1 | 5/2005 | Dror et al. | |
| 2007/0054621 A1* | 3/2007 | Larsson | 455/67.11 |
| 2007/0116046 A1* | 5/2007 | Liu et al. | 370/466 |
| 2007/0149135 A1* | 6/2007 | Larsson et al. | 455/67.13 |
| 2009/0265744 A1* | 10/2009 | Singh et al. | 725/105 |
| 2009/0290632 A1* | 11/2009 | Wegener | 375/240 |
| 2010/0177690 A1 | 7/2010 | O'keeffe et al. | |

FOREIGN PATENT DOCUMENTS

| | | |
|---|---|---|
| KR | 20080056360 A | 6/2008 |
| WO | 2005624924 | 7/2005 |
| WO | 2008152455 A1 | 12/2008 |

OTHER PUBLICATIONS

Search Report Mailed Jan. 21, 2010 for WO family member application PCT/US2009/044551, 12 pages.

(Continued)

*Primary Examiner* — Shuwang Liu
*Assistant Examiner* — Dhaval Patel
(74) *Attorney, Agent, or Firm* — Carolyn Koenig; Haynes Beffel & Wolfeld LLP

(57) ABSTRACT

A signal compression method and apparatus for a base transceiver system (BTS) in a wireless communication network provides efficient transfer of compressed signal samples over serial data links in the system. For the uplink, an RF unit of the BTS compresses baseband signal samples resulting from analog to digital conversion of a received analog signal followed by digital downconversion. The compressed signal samples are transferred over the serial data link to the baseband processor then decompressed prior to normal signal processing. For the downlink, the baseband processor compresses baseband signal samples and transfers the compressed signal samples to the RF unit. The RF unit decompresses the compressed samples prior to digital upconversion and digital to analog conversion to form an analog signal for transmission over an antenna. Compression and decompression can be incorporated into operations of conventional base stations and distributed antenna systems, including OBSAI or CPRI compliant systems.

37 Claims, 18 Drawing Sheets

OTHER PUBLICATIONS

CPRI Specification V3.0 Common Public Radio Interface (CPRI); Interface Specification, Oct. 20, 2006, 89 pages, Ericsson Ab, Huawei Technologies Col Ltd, NEC Corporation, Nortel Networks SA and Siemens Networks GmbH & Co. KG.

OBSAI Open Base Station Architecture Initiative Reference Point 3 Specification Ver. 4.0, Mar. 7, 2007, 119 pages.

OBSAI Open Base Station Architecture Initiative BTS System Reference Document Ver. 2.0, Apr. 27, 2006, 151 pages.

Maruyama, S., et al., "Base Transceiver Station for W-CDMA System," Fujitsu Sci. Tech. J., 38,2, p. 167-73, Dec. 2002.

Office Action Mailed Apr. 12, 2011 in U.S. Appl. No. 12/124,561, 20 pages.

* cited by examiner

| | GSM/EDGE | WCDMA | CDMA | WiMAX |
|---|---|---|---|---|
| Frequency Bands (MHz) | 800, 900, 1800, 1900 | 1800, 1900, 2100 | 800, 1900, 2100 | 2.5, 3.5, 5.8 (GHz) |
| Number of carriers/sector | 1....16 | 1...4 | 1...15 | 1...15 |
| Number of Sectors | 1 - 6 | 1 - 6 | 1 - 6 | 1 - 6 |
| Baseband Modules | 1 - 12 | 1 - 6 | 1 - 12 | 1 - 12 |
| RF Modules | 1 - 9 | 1 - 9 | 1 - 9 | 1 - 9 |
| Antennas/Sector Regular Smart Antenna | 2 - 4 4 - 8 | 2 - 4 4 - 8 | 2 - 4 4 - 8 | 2 - 4 4 - 8 |

Figure 2c
Prior Art

| Bits per Sample | Compression Ratio | BLOCK_SIZE | Payload Bytes per Ethernet Frame | Samples per Payload | Number of Blocks |
| --- | --- | --- | --- | --- | --- |
| 16 | 1:1 (no compression) | --- | 1500 B | 750 | |
| 16 | 2:1 | 150 | 1500 B | 1500 | 10 |
| 14 | 1:1 (no compression) | --- | 1500 B | 750* | |
| 14 | 2.1:1 | 220 | 1467 B | 1760 | 8 |
| 12 | 1:1 (no compression) | --- | 1500 B | 750* | |
| 12 | 2:1 | 200 | 1500 B | 2000 | 10 |

Figure 7

Example Differences or Sums

| Band | Center Freq. | Modified Sample | Example Differences or Sums |
|---|---|---|---|
| 1 | DC | y(i) = x(i) − x(i−1) | x(i): 32767 32702 32508 32186 31737 31163 30465 29648 — 912<br>x(i−1): ---  32767 32702 32508 32186 31737 31163 30465<br>DIFF: ---  −65 −194 −322 −449 −574 −707 −781  — 922 |
| 2 | $f_s/6$ | y(i) = x(i) + x(i−3) | x(i): 32767 16628 −15890 −32756 −17356 −15140 32722 18071<br>x(i−3): ---  ---  ---  32767 16628 −15890 −32756 −17356<br>SUM: ---  ---  ---  11 −728 −750 −34 715  — 932 |
| 3 | $f_s/4$ | y(i) = x(i) + x(i−2) | x(i): 32767 −389 −32758 1166 32730 −1944 −32684 2719 32619<br>x(i−3): ---  ---  32767 −389 −32758 1166 32730 −1944 −32684<br>SUM: ---  ---  9 777 28 −778 46 775 −65  — 942 |
| 4 | $f_s/3$ | y(i) = x(i) − x(i−3) | x(i): 32767 −15792 −17546 32703 −13977 −19233 32513 −12107 −20845<br>x(i−3): ---  ---  ---  32767 −15792 −17546 32703 −13977 −19233<br>DIFF: ---  ---  ---  −64 1815 −1687 −190 1870 −1612 |
| 5 | $f_s/2$ | y(i) = x(i) + x(i−1) | x(i): 32767 −32671 32382 −31906 31239 −30392 29364 −28166 26801  — 952<br>x(i−3): ---  32767 −32671 32382 −31906 31239 −30392 29364 −28166<br>SUM: ---  96 −289 476 −667 847 −1028 1198 −1356 |

Figure 14

COMPRESSION OF BASEBAND SIGNALS IN BASE TRANSCEIVER SYSTEMS

BACKGROUND OF THE INVENTION

The present invention relates to compression and decompression of signals in a transceiver system of a wireless communication network and, more particularly, to compressing baseband signal samples prior to transfer over a serial data link between a base station processor and one or more radio frequency (RF) units of the transceiver system.

Transceiver systems in wireless communication networks perform the control functions for directing signals among communicating subscribers, or terminals, as well as communication with external networks. The general operations include receiving RF signals, converting them to signal data, performing various control and signal processing operations on the signal data, converting the signal data to an RF signal and transmitting the RF signal to the wireless subscriber. Transceiver systems in wireless communications networks include base stations and distributed antenna systems (DAS). For the reverse link, or uplink, a terminal transmits the RF signal received by the transceiver system. For the forward link, or downlink, the transceiver system transmits the RF signal to a subscriber, or terminal, in the wireless network. A base station may also be called a base transceiver system (BTS), cell site, access point, Node B, or other terminology. A terminal may be fixed or mobile and may be a wireless device, cellular phone, personal digital assistant (PDA), personal computer or any device equipped with a wireless modem.

For this description, the term base transceiver system (BTS) will refer to the base station processor(s) and the RF unit(s) in communication with and under the control of the base station processor, including any type or length of data transfer link. This includes the traditional base station having the RF units collocated with the base station processor or on the antenna tower near the antenna. A DAS is another example of a BTS, although the RF units are remote from the base station processor.

The base transceiver systems of wireless communication networks must manage the increasing amounts of data required for offering new services to an expanding subscriber base. System design challenges include ensuring flexibility for evolving standards, supporting growing data processing requirements and reducing overall cost. The modular design approach for base stations provides the flexibility to meet these challenges. The components of modular base station designs include base station processors and RF units coupled by serial data links, comprised of copper wire or fiber optic cabling. The RF units include transmitters, receivers, analog to digital converters (ADCs) and digital to analog converter (DACs). Wire or fiber optic serial data links transfer the sampled signals between the RF units and the base station processor. The sampled signals may be centered at the RF or converted to an intermediate frequency (IF) or baseband prior to transfer over the data link. The base station processor includes functions for signal processing, control and communication with external networks.

Two industry standards for modular designs, the Open Base Station Architecture Initiative (OBSAI) and Common Public Radio Interface (CPRI), specify architectures for interconnection of RF modules and base station processors as well as data transfer protocols for the serial data links. The OBSAI standard is described in the documents, "OBSAI Open Base Station Architecture Initiative BTS System Reference Document", Version 2.0, 2006, and "OBSAI Open Base Station Architecture Initiative Reference Point 3 Specification", Version 4.0, 2007. The CPRI standard is described in the document, "CPRI Specification V3.0 Interface Specification", 2006. Both architectures transmit/receive multichannel signal data and transfer multiplexed baseband signal data over the serial data link. Modular designs may not necessarily comply with CPRI or OBSAI.

The OBSAI standard describes architectures and protocols for communication between base station processors, referred to as baseband modules, and RF modules. Connection topologies for one or more baseband modules and one or more RF modules include mesh, centralized combiner/distributor and bridge modules. The OBSAI compliant serial data link connecting the baseband module and the RF module is referred to as the reference point 3 (RP3) interface. In systems where remote RF units (RRUs) are connected to a baseband module, the serial data link is referred to as the RP3-01 interface. Connection topologies for the baseband module and RRUs include point-to-point, chain, ring and tree-and-branch. The baseband module/RRUs configurations support distributed antenna systems.

The CPRI standard refers to radio equipment control (REC) for processing baseband signal data and the radio equipment (RE) that performs the RF processing for transmission of signals over the antenna. The REC and RE correspond to the base station processor and the RF unit, respectively. The CPRI standard specifies the serial interface and operations at the physical and data link layers. The serial data link between REC and RE, or between two REs, is a bidirectional interface with one transmission line per direction. Connection topologies between the REC and one or more REs include point-to-point, multiple point-to-point, chain, star, tree, ring and combinations thereof.

Distributed antenna systems (DAS) distribute signal data from a main antenna/RF resource to multiple remote antennas connected via Cat5 cable, coaxial cable or fiber optic links. In essence, a DAS can connect to a variety of wireless services and then rebroadcast those signals throughout the areas in which the DAS is installed. For example, a DAS can improve cell phone coverage within a building. A main transceiver and antenna on the roof of the building is connected by cable or fiber to multiple distributed antennas within the building. Every DAS has a "head end" into which source signals are combined for distribution to remote radio units. The DAS systems provide coverage in confined spaces such as high rise buildings, tunnels, railways, and airports. As defined by the DAS Forum of the Personal Communications Industry Association (PCIA), a DAS is a network of spatially separated antenna nodes connected to a common source via a transport medium that provides wireless service within a geographic area or structure. The DAS antenna elevations are generally at or below the clutter level and node installations are compact. A digital serial data link connects the head end (base station) to remote radio units, or heads.

Base transceiver systems for wireless communication networks transfer large amounts of sampled signal data over the serial data links between the base station processor and the RF modules. The need to comply with evolving wireless communication standards, increase data volume and serve more subscribers, may require expensive hardware upgrades to transceiver systems, including increasing the number or capacity of serial data links and increasing the data processing capability of supporting subsystems. These requirements can conflict with constraints on transceiver systems, including physical size limitations, power consumption limitations and geographic restrictions.

Therefore, there is a need for increasing the capacity of serial data links and conserving the resources of base transceiver systems for base stations and distributed antenna systems. Compression of data prior to transfer over the serial data links enables the provider to meet these needs by increasing the capacity of existing data links, possibly eliminating or at least postponing, the need to upgrade the existing data links. Computationally efficient compression and decompression conserves computing resources. The OBSAI and CPRI standards do not disclose compressing signal samples prior to transfer over the serial data links. Therefore, there is also a need for providing compressing signal samples and formatting the compressed samples for compatibility with the data transfer protocols of the BTS.

SUMMARY OF THE INVENTION

Embodiments of the present invention have been made in consideration of the foregoing conventional problems. An object of the present invention is to increase the data transfer capacity of serial data links connecting a base station processor to an RF unit in a base transceiver system of a wireless communication network.

To realize the foregoing object, one aspect of the present invention provides, in a base transceiver system of a wireless communication network, a method for transferring signal data from a radio frequency (RF) unit to a baseband processor over a serial data link, wherein the RF unit is connected to an antenna to receive an analog signal, the analog signal representing a plurality of antenna-carrier channels, the RF unit including an analog to digital converter (ADC) that converts the analog signal to a digital signal and a digital down converter (DDC) that downconverts the digital signal to a plurality of baseband channels, each baseband channel corresponding to one of the antenna-carrier channels and having a sequence of signal samples, wherein each signal sample includes an in-phase (I) sample and a quadrature (Q) sample wherein the baseband processor performs signal processing operations on the signal samples received from the RF unit. The method comprises:

compressing the signal samples of each baseband channel at the RF unit to form compressed samples in accordance with a compression control parameter, wherein each compressed sample includes a compressed I sample and a compressed Q sample;

formatting the compressed samples for transfer over the serial data link;

transferring the compressed samples over the serial data link from the RF unit to the baseband processor;

receiving the compressed samples at the baseband processor; and decompressing the compressed samples corresponding to each baseband channel in accordance with a decompression control parameter to form decompressed signal samples of the corresponding baseband channel, wherein each decompressed signal sample includes a decompressed I sample and a decompressed Q sample, wherein the baseband processor applies the signal processing operations to the decompressed signal samples for each baseband channel.

Another aspect of the present invention that realizes the foregoing object provides, in a base transceiver system of a wireless communication network, a method for transferring signal samples from a baseband processor to a radio frequency (RF) unit over a serial data link, each signal sample associated with one of a plurality of baseband channels, wherein each signal sample includes an in-phase (I) sample and a quadrature (Q) sample, the RF unit including a digital up converter (DUC) that upconverts a sequence of signal samples of each baseband channel to a corresponding one of a plurality of antenna-carrier channels to form a single upconverted digital signal and a digital to analog converter (DAC) that converts the upconverted digital signal to an analog signal, wherein the RF unit is coupled to an antenna to transmit the analog signal, the analog signal representing the plurality of antenna-carrier channels. The method comprises:

compressing the signal samples corresponding to each baseband channel at the baseband processor to form compressed samples in accordance with a compression control parameter wherein each compressed sample includes a compressed I sample and a compressed Q sample;

formatting the compressed samples for transfer over the serial data link;

transferring the compressed samples over the serial data link from the baseband processor to the RF unit;

receiving the compressed samples at the RF unit; and decompressing the compressed samples in accordance with a decompression control parameter to form decompressed signal samples corresponding to each baseband channel, wherein each decompressed sample includes a decompressed I sample and a decompressed Q sample, wherein the decompressed signal samples are provided to the DUC for forming the upconverted digital signal.

Another aspect of the present invention that realizes the foregoing object provides, in a base transceiver system of a wireless communication network, including a radio frequency (RF) unit coupled to an antenna to receive an analog signal and a baseband processor coupled to the RF unit by a serial data link, the analog signal representing a plurality of antenna-carrier channels, the RF unit including an analog to digital converter (ADC) that converts the analog signal to a digital signal and a digital down converter (DDC) that downconverts the digital signal to a plurality of baseband channels, each baseband channel corresponding to one of the antenna-carrier channels and having a sequence of signal samples, wherein each signal sample includes an in-phase (I) sample and a quadrature (Q) sample wherein the baseband processor performs signal processing operations on the signal samples received from the RF unit, an apparatus for data transfer from the RF unit to the baseband processor over the serial data link. The apparatus comprises:

a plurality of compressors at the RF unit, each compressor coupled to receive the signal samples of a corresponding baseband channel output from the DDC and producing compressed samples in accordance with a compression control parameter, wherein each compressed sample includes a compressed I sample and a compressed Q sample;

a formatter coupled to the plurality of compressors and formatting the compressed samples in accordance with a data transfer protocol;

the serial data link coupled to the formatter for transferring the compressed samples to the baseband processor;

the baseband processor coupled to the serial data link to receive the compressed samples; and a plurality of decompressors integrated into the baseband processor, each decompressor receiving the compressed samples of the corresponding baseband channel and forming decompressed signal samples in accordance with a decompression control parameter, wherein each decompressed signal sample includes a decompressed I sample and a decompressed Q sample, wherein the baseband processor performs the signal processing operations on the decompressed signal samples for each baseband channel.

Another aspect of the present invention that realizes the foregoing object provides, in a base transceiver system of a wireless communication network, including a radio frequency (RF) unit coupled to an antenna to transmit an analog signal and a baseband processor coupled to the RF unit by a serial data link, the baseband processor providing a plurality of signal samples to the RF unit, each signal sample associated with one of a plurality of baseband channels, wherein each signal sample includes an in-phase (I) sample and a quadrature (Q) sample, the RF unit including a digital up converter (DUC) that upconverts a sequence of signal samples of each baseband channel to a corresponding one of a plurality of antenna-carrier channels to form a single upconverted digital signal and a digital to analog converter (DAC) that converts the upconverted digital signal to the analog signal, the analog signal representing the plurality of antenna-carrier channels, an apparatus for data transfer from the baseband processor to the RF unit. The apparatus comprises:

- a plurality of compressors integrated into the baseband processor, each compressor compressing signal samples of a corresponding baseband channel in accordance with a compression control parameter to form compressed samples, wherein each compressed sample includes a compressed I sample and a compressed Q sample;
- a formatter coupled to the plurality of compressors and formatting the compressed samples in accordance with a data transfer protocol;
- the serial data link coupled to the formatter for transferring the compressed samples to the RF unit;
- the RF unit coupled to the serial data link to receive the compressed samples; and
- a plurality of decompressors at the RF unit, each decompressor receiving compressed samples of the corresponding baseband channel and forming decompressed signal samples, wherein each decompressed signal sample includes a decompressed I sample and a decompressed Q sample, wherein the decompressed signal samples are provided to the DUC for forming the upconverted digital signal.

BRIEF DESCRIPTION OF THE DRAWINGS

FIG. 2c is a table of the wireless modulation formats supported by the OBSAI standard, in accordance with the prior art.

FIG. 7 is a table showing three numerical examples for mapping compressed data to Ethernet payloads.

FIG. 14 gives the sums or differences of signal samples x(i) and x(i−j) for the examples of FIG. 11.

DETAILED DESCRIPTION

The following describes how compression and decompression are incorporated into base transceiver systems in accordance with the present invention. Example architectures include compression and decompression in a general base station, OBSAI or CPRI base stations and distributed antenna systems. The preferred methods for compression and decompression applied to the signal samples processed by the transceiver systems are then described.

Figure 1A:
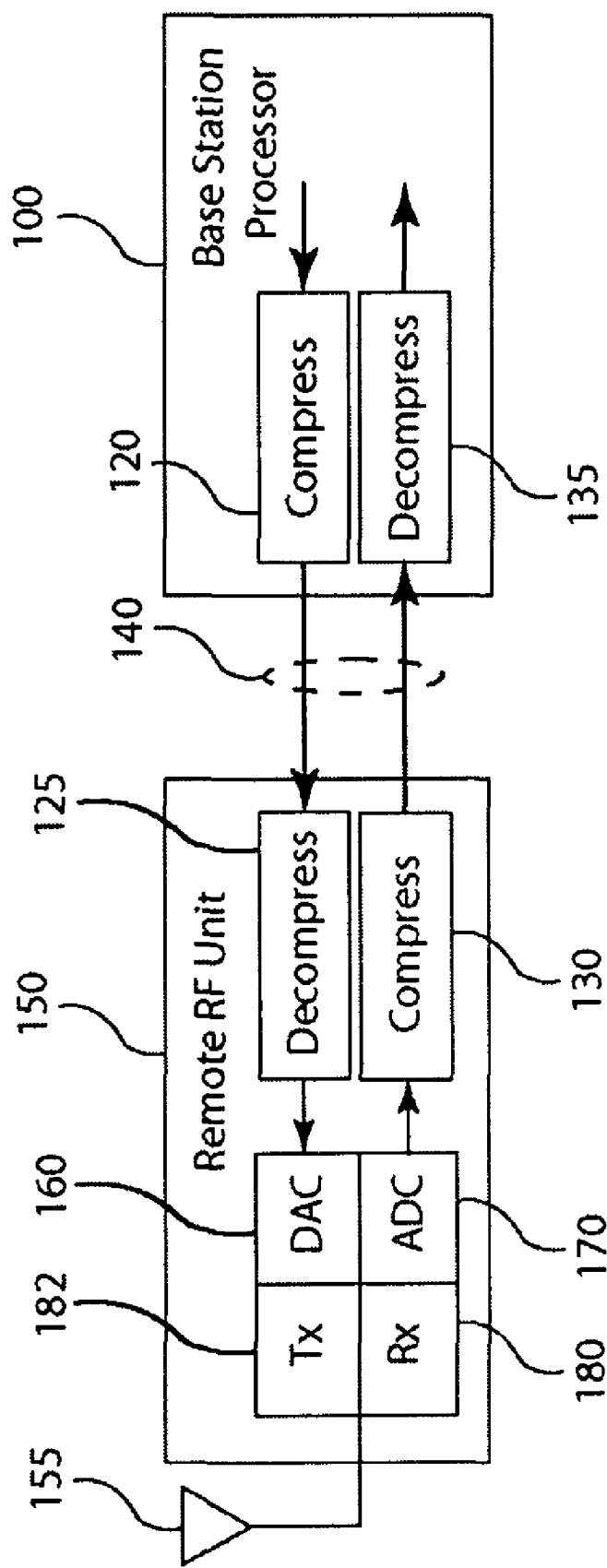
FIG. 1a is a block diagram of a general base station architecture that incorporates compression and decompression.

FIG. 1a is a block diagram of a general base station architecture that incorporates compression and decompression in accordance with the present invention. The BTS architecture includes the base station processor 100 connected by one or more serial data links 140 to a RF unit 150. This general architecture can be used for any air interface standard employed by wireless communication network, including GSM/EDGE, CDMA based modulation formats, OFDM based modulation formats such as WiMax and other signal modulation formats that may evolve. The remote RF unit 150 can be located near the antenna 155 on an antenna tower. The RF unit 150 can be connected to multiple antennas for transmission, reception, diversity or beamforming. The serial data link 140 can be implemented by fiber optic, coaxial cable or RJ-45 twisted pair. The base station processor 100 performs signal processing functions to prepare data for transmission by the RF unit 150 or recover data from signal samples received from the RF unit 150. The types of functions include symbol modulation/demodulation, channel encoding/decoding, spreading/despreading for CDMA, diversity processing for transmission/reception, interference cancellation, equalization, time and frequency synchronization, upconverting/downconverting, multiplexing/demultiplexing and data transport to/from an external network (not shown).

For the transmit path, or downlink, the base station processor 100 performs the signal processing functions to modulate communication data that were extracted from previously received wireless signals or received from an external network to produce digital signals. The signal processing functions depend on the modulation format and can include symbol modulation, channel coding, spreading for CDMA, diversity processing for transmission, time and frequency synchronization, upconverting, multiplexing, and inverse discrete Fourier transformation for OFDM. The digital signals may have a center frequency of 0 Hz, an intermediate frequency (IF) or a radio frequency (RF), depending on the system design. The compressor 120 compresses the samples of the digital signal prior to transfer over a serial data link 140 to the RF unit 150. At the RF unit 150, the decompressor 125 decompresses the compressed samples to reconstruct the digital signal before digital to analog conversion. The digital to analog converter (DAC) 160 converts the reconstructed digital signal to an analog signal. The transmitter 182 prepares the analog signal for transmission by the antenna 155, including up-conversion to the appropriate radio frequency, RF filtering and amplification.

For the receive path, or uplink, antenna 155 at the RF unit 150 receives an RF analog signal representing modulated communication data from one or more wireless sources, or subscribers. The frequency band of the received signal can be a composite of transmitted signals from multiple wireless subscribers. Depending on the air interface protocol, the different subscriber signals can be assigned to certain frequency channels or multiple subscribers can be assigned to a particular frequency band. In the case of CDMA air interface protocols, the multiple subscriber signals are assigned to a particular frequency band and each subscriber signal is spread across the band using a unique spreading code. The receiver 180 performs analog operations on the RF analog signal, including RF filtering, amplification and down-conversion to shift the center frequency of the received signal from RF to an IF or 0 Hz, depending on system design The analog to digital converter (ADC) 170 converts the received analog signal to a digital signal to produce signal samples that have only real values or, alternatively, have in phase (I) and quadrature (Q) components, based on system design. The compressor 130 is applied to the entire bandwidth of the digital signal output from the ADC 170. The compressor 130 compresses the digital signal samples before transmission over the serial data link 140. At the base station processor 100, the decompressor 135 decompresses the compressed samples to reconstruct the digital signal prior to performing the normal signal processing to recover communication data from the decompressed digital signal. The processing operations can include demodulating symbols, channel decoding, despreading (for CDMA modulation formats), diversity processing, interference cancelling, equalizing, time and frequency synchronization, downconverting, demultiplexing, discrete Fourier transformation (for OFDM modulation formats) and transporting data derived from the decompressed signal samples to an external network.

The base station processor 100 and RF unit 150 may be referred to by other names in the art and do not limit scope of the present invention, as described in the claims.

Figure 1B:
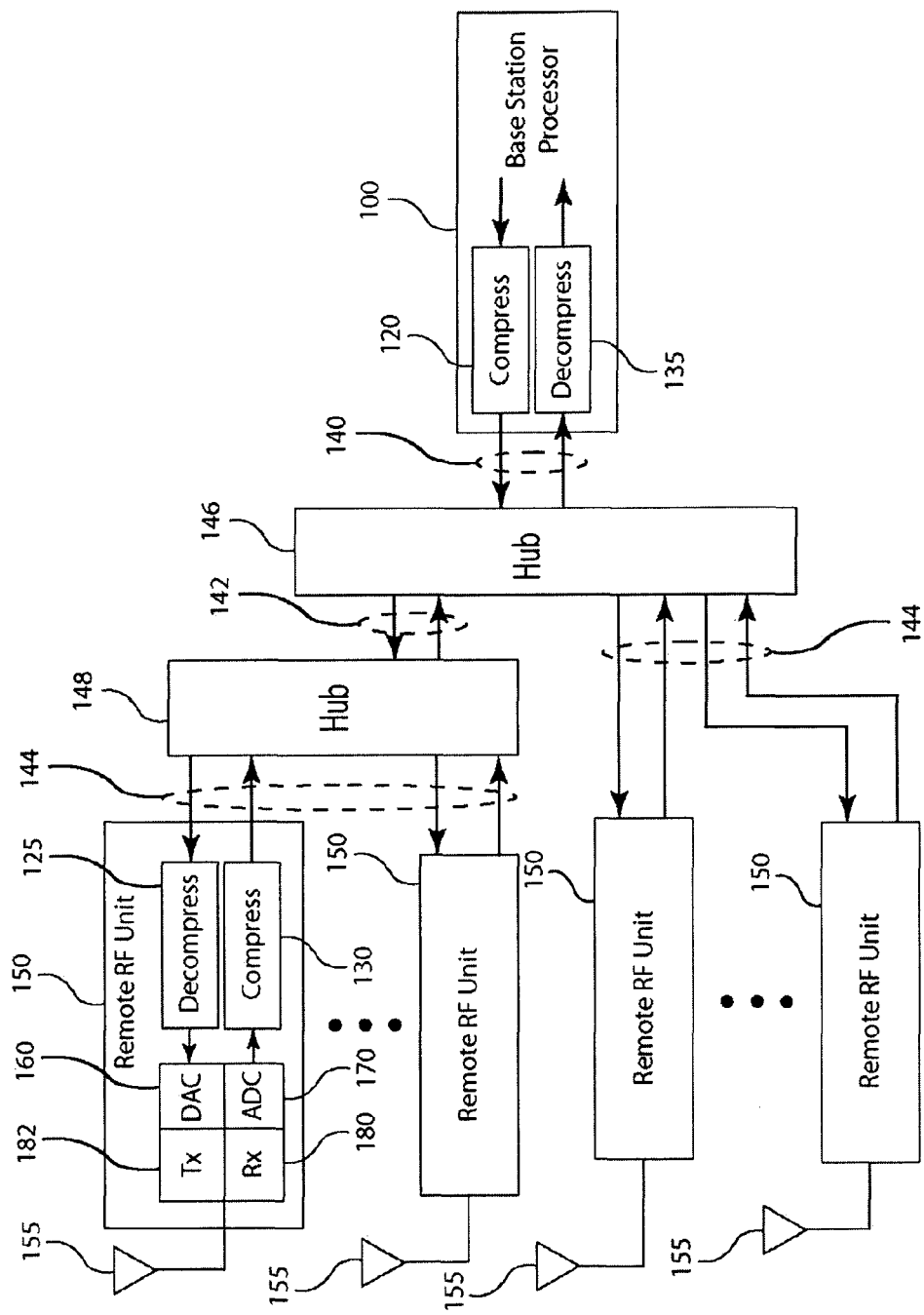
FIG. 1b is a block diagram of an example of a distributed antenna system (DAS) including compression and decompression.

FIG. 1b is a block diagram of an example of a distributed antenna system (DAS). The base station processor 100 is connected to a plurality of remote RF units 150 and their associated antennas 155. The DAS can have a plurality of remote RF units 150 that typically are located tens to hundreds of meters from the base station processor 100. The base station processor 100 is part of a main transceiver system, such as the BTS shown in FIG. 1a, that typically has collocated RF. The main transceiver may be located on the roof of a building, for example. Each remote RF unit 150 includes a compressor 130, decompressor 125, ADC 170, DAC 160, transmitter 182 and receiver 180, although these components are represented in only one remote RF unit 150 for simplicity. In this example, the base station processor 100 is connected to the remote RF units 150 via a hub 146. The hub 146 is then connected via data link 142 to another hub 148 or via links 144 to a plurality of remote RF units 150. These data links 140,142 and 144 may have identical characteristics or may be different depending on the system design. For the transmit path, the base station processor 100 applies the compressor 120 to compress signal samples. The compressed samples are transferred via data link 140 to the hub 146, via data link 142 to another hub 148 and via data links 144 to a plurality of remote RF units 150. Compressed data can remain compressed when passing through the hubs 146 and 148. At each remote RF unit 150, the decompressor 125 decompresses the signal before digital to analog conversion 160. The transmitter 182 processes the resulting analog signal for transmission via antenna 155. For the receive path at each remote RF unit 150, each antenna 155 provides an analog signal to the receiver 180. The ADC 170 converts the received analog signal to a digital signal. The compressor 130 compresses the digital signal before transfer via the appropriate data link 140, 142 or 144 and hubs 148 and 146 to the base station processor 100. The decompressor 135 decompresses the compressed signal samples to reconstruct the received digital signal before conventional signal processing by the base station processor 100. Distributed antenna systems may transfer IF or RF digital signals over the data links 140, 142 and 144, as described with respect to FIG. 1a, or may transfer digital baseband signals as further described in the following.

The compressor 120/130 packs the compressed samples in compressed data packets having a format compatible with the data transfer protocol of the serial data link. The compressor 120/130 adds a header portion to some or all of compressed data packets. Alternatively, the header can be encoded in overhead bits, if available for the data transfer protocol. The header portion has a defined length and includes synchronization and control information for the decompressor 125/135. The compressor 120/130 may pack the compressed samples in any order; however the decompressor 125/135 will reorder and format the decompressed samples to comply with the data representation format expected by the BTS. The serial data link may have a proprietary data transfer protocol or a standard protocol, such as Ethernet. The compressed data packet size is set to accommodate the data transfer protocol. For example, for transfer in an Ethernet MAC frame, the compressed data packet can be sized to fit into the payload portion, as described below with respect to FIGS. 6 and 7. The decompressor 125/135 receives Ethernet MAC frame and extracts the compressed data packet from the payload portion. The decompressor 125/135 extracts the synchronization and control information from the header for decompressing and reconstructing the sequence of signal samples.

Figure 2A:
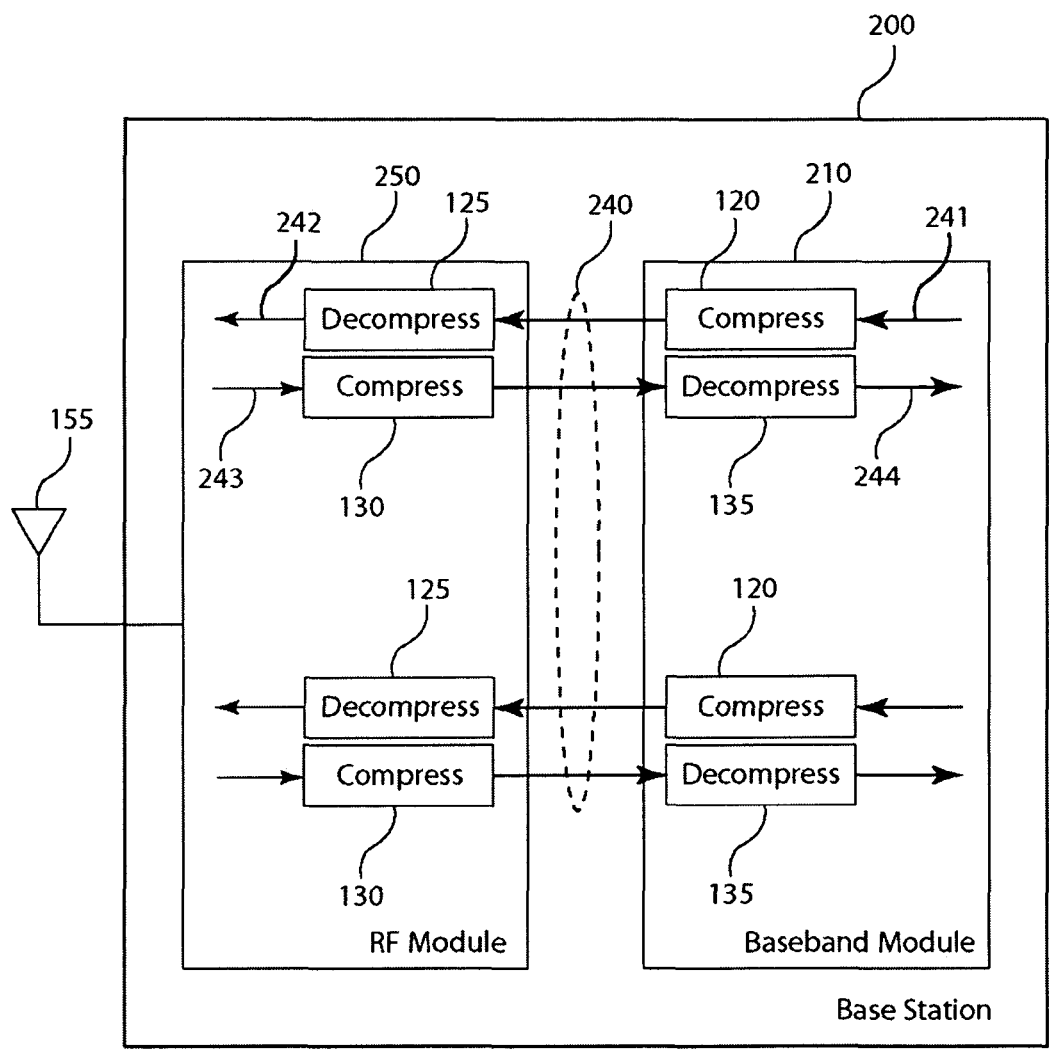
FIG. 2a is a block diagram of compression and decompression in a base station modeled after OBSAI standard.

FIG. 2a is a block diagram of compression and decompression in a base station modeled after OBSAI standard. The OBSAI standard specifies processing and transfer of baseband I and Q signal samples. The base station 200 includes a baseband module 210 and a RF module 250 connected via one or more RP3 serial data links 240. There can be multiple baseband modules 210 in communication with multiple RF modules 250. The OBSAI architecture supports the air interface standards for GSM/EDGE, CDMA, WCDMA and WiMax for fixed or mobile access having configurations listed in Table 1 of FIG. 2c. The OBSAI standard can also accommodate other wireless network configurations or signal modulation formats by incorporating general purpose modules. The baseband module 210 performs signal processing functions on baseband signal data appropriate for the modulation format. The signal processing functions can include symbol modulation/demodulation, channel coding/decoding, spreading/despreading, diversity processing for transmission/reception, interference cancellation, equalization, time and frequency synchronization, inverse/forward discrete Fourier transform, as appropriate for the air interface standard or other modulation format, and data transport to/from an external network (not shown). The RF module 250 may contain transmit functionality only, receive functionality only, or both transmit and receive functionalities. The OBSAI RF module functions include ADC/DAC, up/down conversion, carrier selection, antenna interface, Tx/Rx RF filtering, RF combining, diversity Tx/Rx and air interface functions. Options for the serial data links 240 include fiber optic cable, copper cable or wireless transmission. The RP3 bus protocol defines the data format and line coding for data transfer. Both the baseband module 210 and the RF module 250 format the compressed data for transfer in accordance with the RP3 bus protocol.

For the transmit path, or downlink, the baseband module 210 performs various functions on communication data appropriate for the modulation format to generate baseband signal samples 241. The functions can include symbol modulation, channel coding, spreading, transmit diversity processing and inverse discrete Fourier transform as appropriate for the OBSAI supported or other signal modulation format. The compressor 120 compresses signal samples 241 before transfer via the serial data link 240 to the RF Module 250. At the RF module 250, the decompressor 125 decompresses the compressed samples to form decompressed signal samples 242 prior to the normal processing for RF transmission.

For the receive path, or uplink, the antenna 155 receives analog RF signals representing modulated communication data from the subscribers. The operations of the RF module 250 to form the baseband digital signal samples 243 will be described in more detail below with respect to FIG. 4. The compressor 130 compresses the digital signal samples 243 prior to transfer via serial data link 240 to the baseband module 210. At the baseband module 210, the decompressor 135 decompresses the compressed samples to form decompressed signal samples 244. The baseband module 210 then applies the signal processing appropriate for the modulation format to the decompressed signal samples. The signal processing functions can include symbol demodulation, channel decoding, despreading, receive diversity processing, interference cancellation, equalization, time and frequency synchronization, forward discrete Fourier transform, as appropriate for the air interface standard or other modulation format. Although FIG. 2a depicts a point-to-point arrangement other connection arrangements are possible, including mesh topologies, bridge connections and combiner/distributor connections.

Figure 2B:
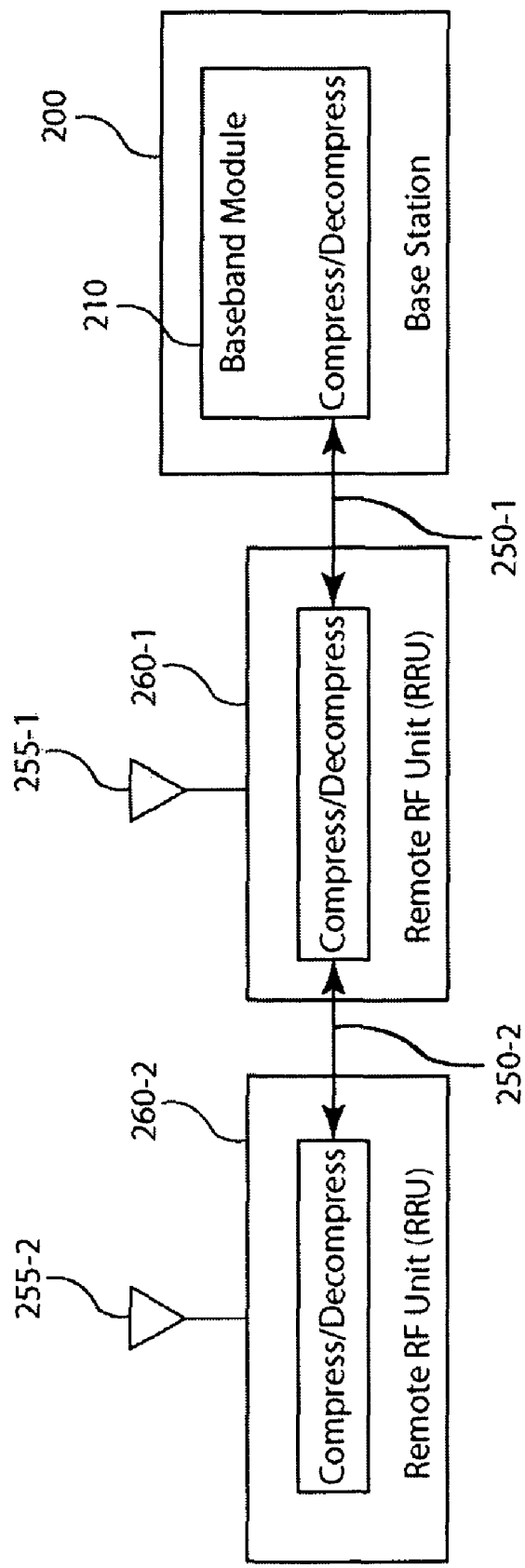
FIG. 2b is a block diagram of compression and decompression in an OBSAI compliant BTS having remote RF units.

FIG. 2b is a block diagram of compression and decompression in an OBSAI compliant BTS having remote RF units. In this example, the base station 200 is connected to two remote RF units (RRUs) 260-1 and 260-2. The serial data links 250-1 and 250-2 comply with the RP3-01 serial data link protocol as defined by the OBSAI specification. The RP3-01 protocol extends the RP3 protocol to accommodate physical layer technologies suitable for transporting data over longer physical links. A local converter (LC), implemented as a separate module or integrated with the BTS 200 or RRU 260, maps data to the RP3-01 data format. The RP3-01 protocol uses the Ethernet MAC frames in accordance with the standard IEEE 802.3-2002. A point-to-point Ethernet transfer is applied between the RP3-01 nodes, whether between RRUs 260-1 and 260-2 or between BTS 200 and RRU 260-1. The RRU 260-1 includes an Ethernet switch that determines whether a data frame is consumed at that RRU 260-1 or forwarded to the RRU 260-2. For the transmit paths, the baseband module 210 compresses the payload signal data prior to transfer over the data link 250-1 in accordance with the RP3-01 protocol. If the RRU 260-1 is the destination node, the RRU 260-1 decompresses the compressed data prior to processing for RF transmission from antenna 255-1. If the RRU 260-2 is the destination node, the RRU 260-1 passes the data frame with the compressed payload data over link 250-2 to RRU 260-2. The RRU 260-2 decompresses the compressed payload data for transmission from antenna 255-2. For the receive paths, the RRUs 260-1 and 260-2 compress their respective received signal samples and format the compressed signal data for transfer in accordance with RP3-01 protocol. The baseband module 210 decompresses the compressed signal data received from the RRUs 260-1 and 260-2 prior to the normal baseband operations. The RRU 260-1 will pass the data frames it received from RRU 260-2 to the BTS 200 without decompressing the payload data.

Figure 3A:
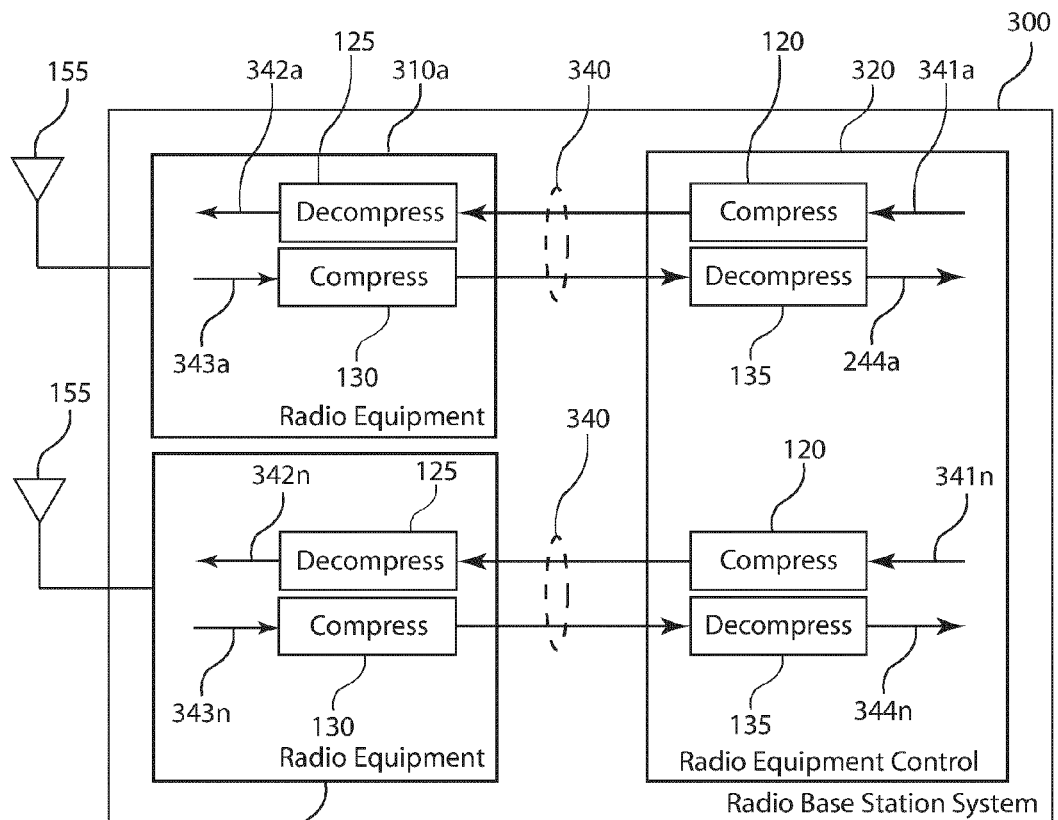
FIG. 3a is a block diagram of compression and decompression in a base station modeled after the CPRI standard.

FIG. 3a is a block diagram of compression and decompression in a base station modeled after the CPRI standard. The CPRI standard specifically supports UTRA/FDD standard (Universal Terrestrial Radio Access/Frequency Division Duplex, uses WCDMA modulation format) and WiMax standard (IEEE802.16-2004 and IEEE802.16e-2005) but can also be used for other air interface modulation formats. In the CPRI model, the radio base station system 300 includes the radio equipment control (REC) 320 and the radio equipment (RE) 310. These two components are connected via serial data links 340 comprising bidirectional links using wire or fiber optic media. The REC 320 performs signal processing functions on baseband signal samples, including channel coding/decoding, interleaving, spreading/dispreading (UTRA/FDD) and inverse/forward discrete Fourier transform (WiMax). The RE functions prepare signal samples for the air interface or generate signal samples from the received analog signal, including ADC/DAC, up/down conversion, carrier multiplexing/demultiplexing, Tx/Rx amplification and RF filtering. The RE 310 is connected to one or more antennas 155. The CPRI standard indicates 1, 2 or 6 antennas per RE with 1-4 carriers per antenna.

Figure 3B:
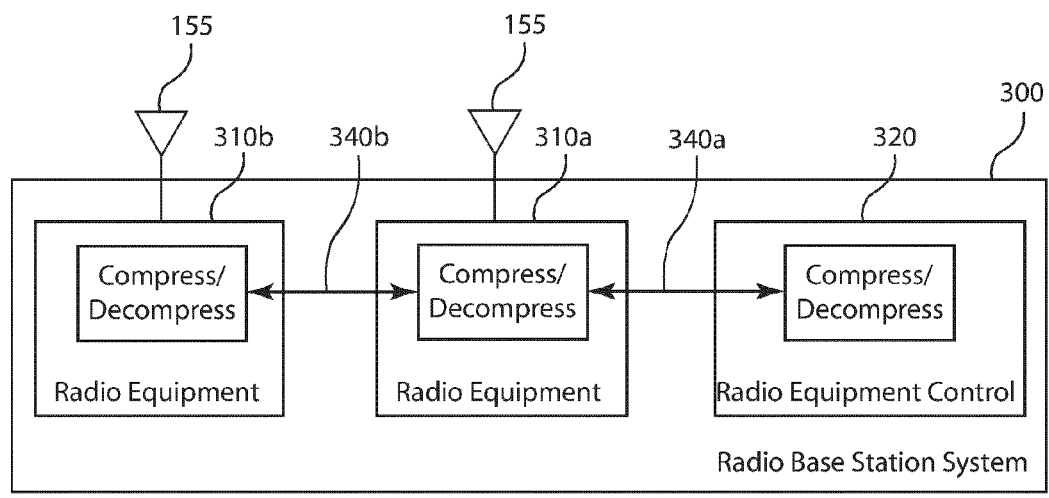
FIG. 3b shows a radio base station system 300 where the REC 320 and multiple radio equipments 310a and 310b are connected in a chain arrangement via data transfer links 340a and 340b.

For the transmit path, or downlink, from the REC 320, the compressor 120 compresses signal samples 341a before transfer via the serial data link 340 to the RE 310. At the RE 310, the decompressor 125 decompresses the compressed signal data to produce decompressed signal samples 342a. The decompressed signal samples 342a are further processed for transmission over antenna 155. For the receive path, or uplink, the RE 310 processes signals received by the antenna 155 to form baseband digital signal samples 343a. The compressor 130 compresses the samples before transfer via the serial data link 340. At the REC 320, the decompressor 135 decompresses the received compressed samples to form decompressed samples 244a. The REC 320 performs the normal processing functions on the decompressed samples 244a. The functions of the RE 310 and REC 320 are further described below with respect to FIG. 4. FIG. 3a shows a point-to-point link between the REC 320 and the RE 310. Other topologies include multiple point-to-point links between REC 320 and RE 310 and multiple point-to-point links between one REC 320 and more than one RE 310. FIG. 3b shows a radio base station system 300 where the REC 320 and multiple radio equipments 310a and 310b are connected in a chain arrangement via data transfer links 340a and 340b. Other topologies where REs connect to each other include tree, ring, and star.

Figure 4:
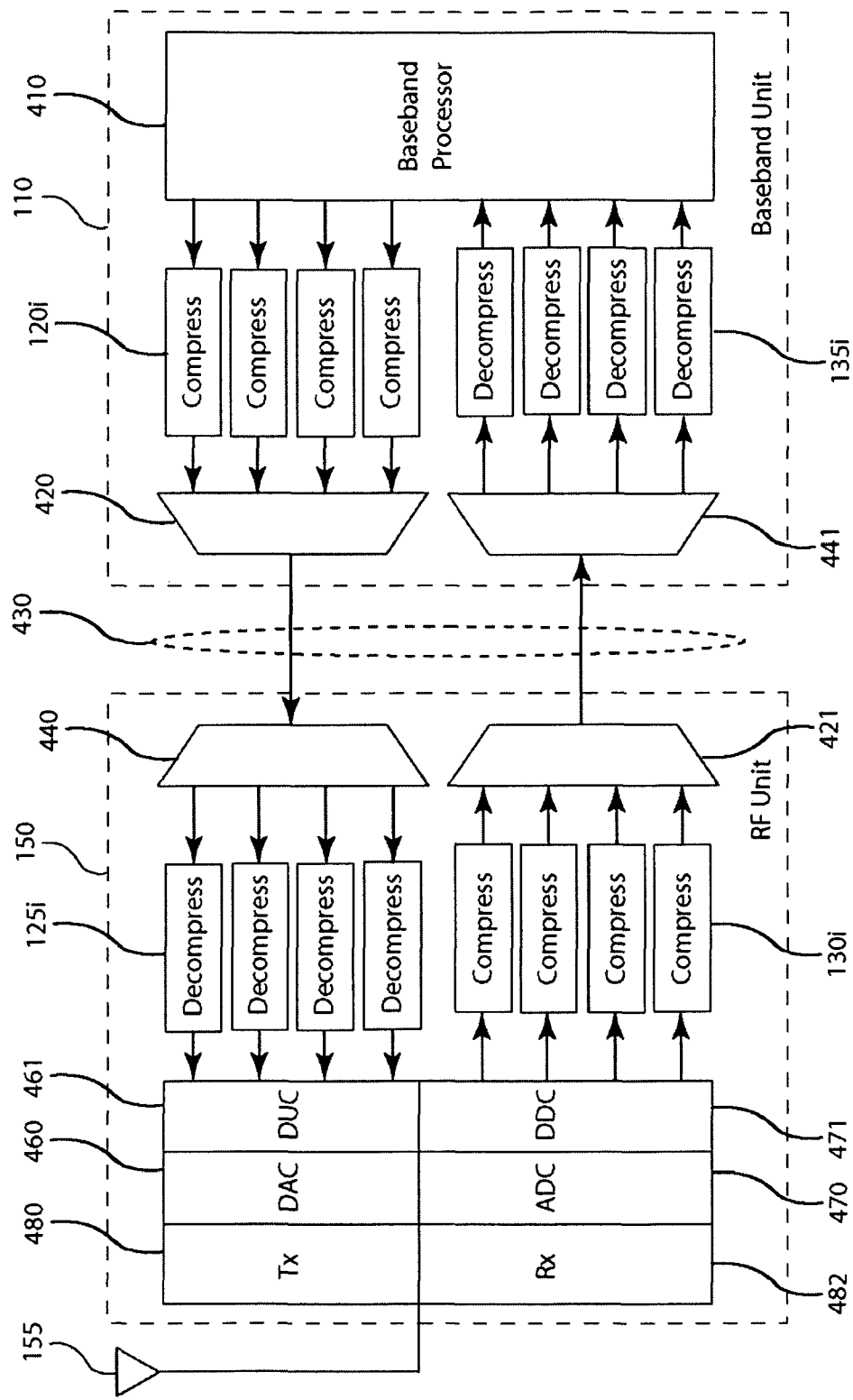
FIG. 4 is a block diagram of compression and decompression where multiple signal channels are compressed and multiplexed before transfer over a serial data link.

FIG. 4 is a block diagram of compression and decompression where multiple signal channels are compressed and multiplexed before transfer over a serial data link. Both OBSAI and CPRI transceivers receive and transmit multiple frequency channels of signal samples for each independent antenna, or multiple antenna-carriers. In this example, there are four channels of signal samples representing four antenna-carriers. The signal samples comprise baseband I and Q samples. For the transmit path, each compressor 120*i* in the baseband unit 110 independently compresses a stream of baseband I,Q signal samples to form corresponding streams of compressed samples. The multiplexer 420 multiplexes the compressed samples into a single serial data stream for transfer over serial data link 430 in accordance with the standard. At the RF unit 150, the demultiplexer 440 demultiplexes the serial data stream to recover the four streams of compressed samples in accordance with the standard. Each decompressor 125*i* decompresses one stream of compressed samples to reconstruct the corresponding baseband I,Q signal samples. The digital upconverter (DUC) 461 upconverts each stream of decompressed signal samples to respective carrier frequencies to form a channelized signal. Each upconverted digital signal occupies a particular channel of the resulting channelized signal. The DAC 460 converts the channelized signal to an analog signal. The transmitter 480 converts the analog signal to the appropriate RF frequency for transmission by the antenna 155. For the receive path, the receiver 482 receives the RF signal and the ADC 470 digitizes the received signal to produce a digital signal that represents a channelized signal data as described for the transmit path. The digital down converter (DDC) 471 downconverts each channel to form corresponding streams of baseband I,Q signal samples, one for each channel. The compressor 130*i* compresses its input signal samples to form compressed samples. The multiplexer 421 multiplexes the streams of compressed samples output from the compressors to form a serial data stream in accordance with the OBSAI or CPRI standards. The serial data stream is transferred via the serial data link 430 to the baseband unit 110. The demultiplexer 441 demultiplexes the serial data to restore the four streams of compressed samples. Each decompressor 135*i* reconstructs the corresponding I,Q signal samples prior to the normal operations by the baseband processor 410.

The compressors 120*i* and 130*i* organize the compressed samples into compressed data packets compatible with the OBSAI, CPRI or other protocols. The compressed data packets represent compressed I and Q samples. The order of the compressed samples may be sequential interlaced compressed I and Q samples, i.e. ($I_1 Q_1 I_2 Q_2 \ldots I_N Q_N$). Alternatively, the order of the compressed I and Q samples may have blocks of compressed I samples followed by blocks of compressed Q samples, i.e. ($I_1 I_2 \ldots I_N Q_1 Q_2 \ldots Q_N$). The compressors 120*i*/130*i* operate on blocks of consecutive input signal samples having a length of BLOCK_SIZE. The compressor 120*i*/130*i* compresses BLOCK_SIZE consecutive samples and forms a compressed data packet.

A useful BLOCK_SIZE is 192, although other block sizes can be used. The block size of 192 samples provides for simple double-buffered input blocks for field programmable gate arrays (FPGA). A smaller block size, such as 4 to 8 samples, can be implemented to meet the more stringent latency requirements of the OBSAI and CPRI specifications. To meet a latency specification, the block size in samples should span a time period that is less than or equal to half the allowable latency period. This assumes that half of the latency is consumed for compression and the other half for decompression. For example, the CPRI specifies an allowable latency period of 5 μsec. For the UTRA-FDD signal format having one sample per chip at a chip rate of 3.84 MHz, the allowable latency of 5 μsec. spans about 19 sample intervals. A block size of 4 samples will have a latency period of 8 sample intervals which is well within the allowable latency period for CPRI.

The compressor 120*i*/130*i* may add a header portion to some or all of the compressed data packets. The header portion has a defined length, for instance 16 bits. Alternatively, the header information can placed in overhead fields of the OBSAI or CPRI message format. In an alternative for OBSAI, header information can be encoded using unused codes of an OBSAI message's TYPE field. In an alternative for CPRI, header information can be encoded in stuffing bits of the basic frame. The compressor 120*i*/130*i* provides the compressed data packet to the payload portion of the OBSAI or CPRI message format. The decompressor 125*i*/135*i* receives the OBSAI or CPRI message and extracts the compressed data packet from the payload portion. The decompressor 125*i*/135*i* uses the header to extract control parameters for decompression and to establish compressed data packet synchronization. The decompressor 125*i*/135*i* reconstructs the sequence of I, Q signal samples in the I and Q sample order, byte order and data format specified by the OBSAI, CPRI or other protocol. Control messages used by OBSAI or CPRI are not compressed.

Figure 5:
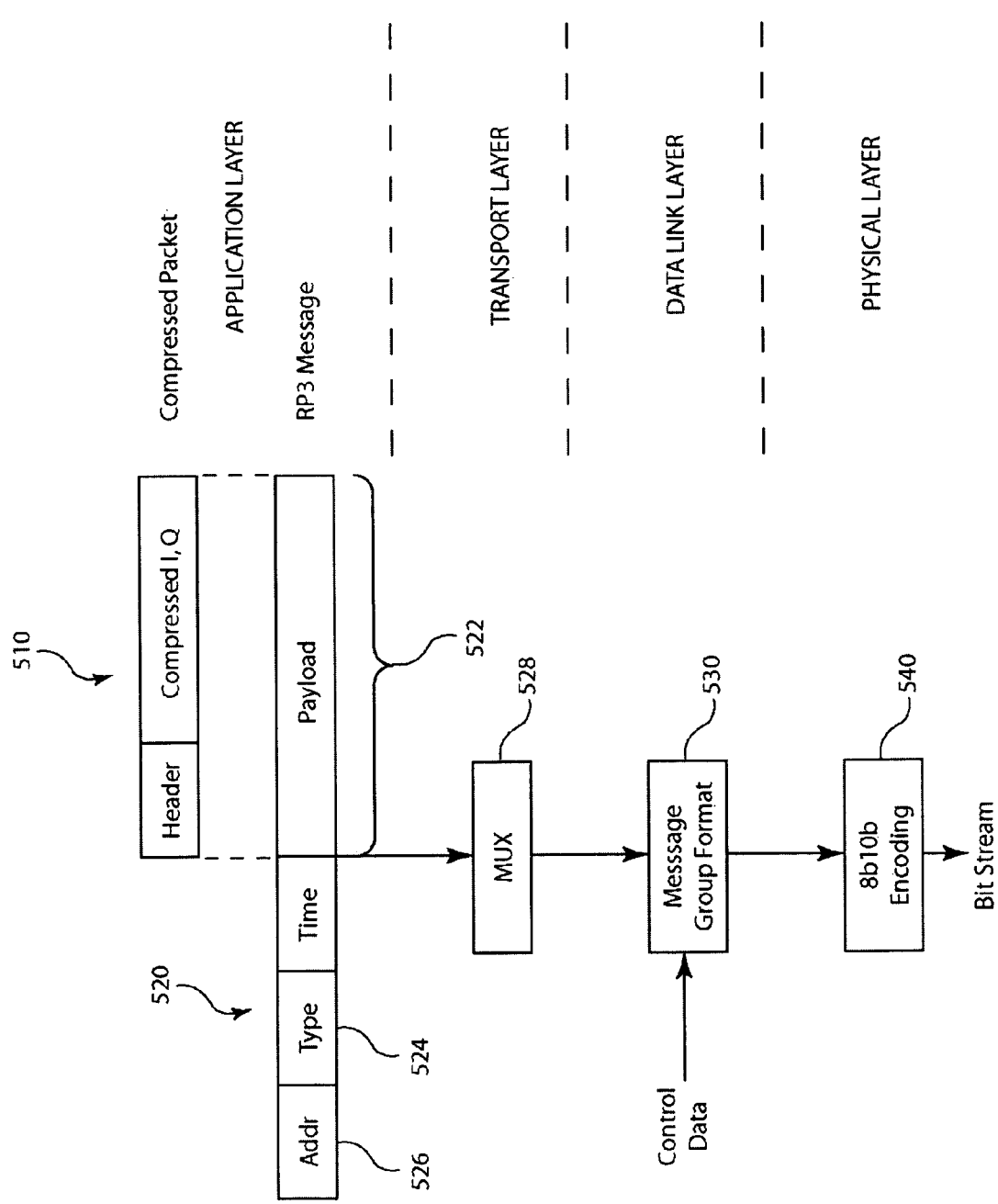
FIG. 5 illustrates an example of mapping a compressed data packet to the payload portion of an RP3 message.

The OBSAI standard's RP3 and RP3-01 bus protocols include features useful for transfer of compressed data packets. The OBSAI application layer message format has a fixed size of 19 bytes, or 152 bits, including 3 bytes allocated for address/type/timestamp and 16 bytes, or 128 bits, allocated for payload. The type fields include W-CDMA/FDD, W-CDMA/TDD, 802.16, LTE and Ethernet. A compressed data packet can be set to a length of 128 bits to fit the payload portion. The OBSAI physical layer applies 8b10b encoding to each byte of the message, including the payload, prior to transfer over the data link. The RP3 protocol defines a message group that includes up to 65,536 messages and up to 20 idle bytes and a frame including up to an integer multiple times 65,536 consecutive message groups, where the integer multiple is 1, 2 or 4. The integer multiple relates the frame length in bits to the data transfer rate of the serial data links of 768 Mbps (i=1), 1536 Mbps (i=2) and 3072 Mbps (i=4). The time interval for a frame is fixed at 10 msec. FIG. 5 illustrates an example of mapping a compressed data packet to the payload portion 522 of an RP3 message 520. The type field 524 indicates the data type of the signal samples, for example W-CDMA/FDD. The address 526 is used for routing at the transport layer. The transport layer function includes the message multiplexer 528 that multiplexes RP3 message 520 with other RP3 messages (not shown) in accordance with the system configuration and routing requirements. At the data link layer, the message group formatter 530 assigns multiple messages to message slots and adds control data and idle bytes to form a message group. At the physical layer, the 8b10b encoder 540 encodes each byte to 10 bits to form a portion of the bit stream for transfer over the serial data link. Referring to FIG. 4, for OBSAI systems, the multiplexers 420 and 421 perform the functions described with respect to FIGS. 5 and 6 on the compressed data packets 510 from each group of compressors 120*i* and 130*i*. For OBSAI systems, the demultiplexers 440 and 441 perform the inverse operations, including 8b10b decoding, message demultiplexing and extracting the payload data from the RP3 message 520 to retrieve the compressed data packet 510. For the example of FIG. 6, the payload data from the Ethernet MAC frame 550 is reassembled from the payload data from RP3 packets 630-1 to 630-*n*. The compressed data packet 510 is retrieved from the payload data of the Ethernet MAC frame 550. These inverse operations are described in the above referenced OBSAI standards documents. The corresponding compressed data packets are input to decompressors 125i and 135i.

For example, a 10 msec. OBSAI frame accommodates 38,400 chips for W-CDMA signals. For data rates of 768 Mbps, 1536 Mbps, and 3072 Mbps and 8b10b encoding, the user data transferred during 10 msec. have 6.144 Mbits, 12.288 Mbits, and 24.576 Mbits. Each antenna-carrier uses 3.84 MHz*32 bits*1.25=153.6 Mbps of link bandwidth. Thus, a 768 Mbps link can carry 4 antenna-carriers (16 bits I, 16 bits Q). For a compression ratio of 2:1, the 768 Mbps link will carry 8 antenna-carriers.

Figure 6:
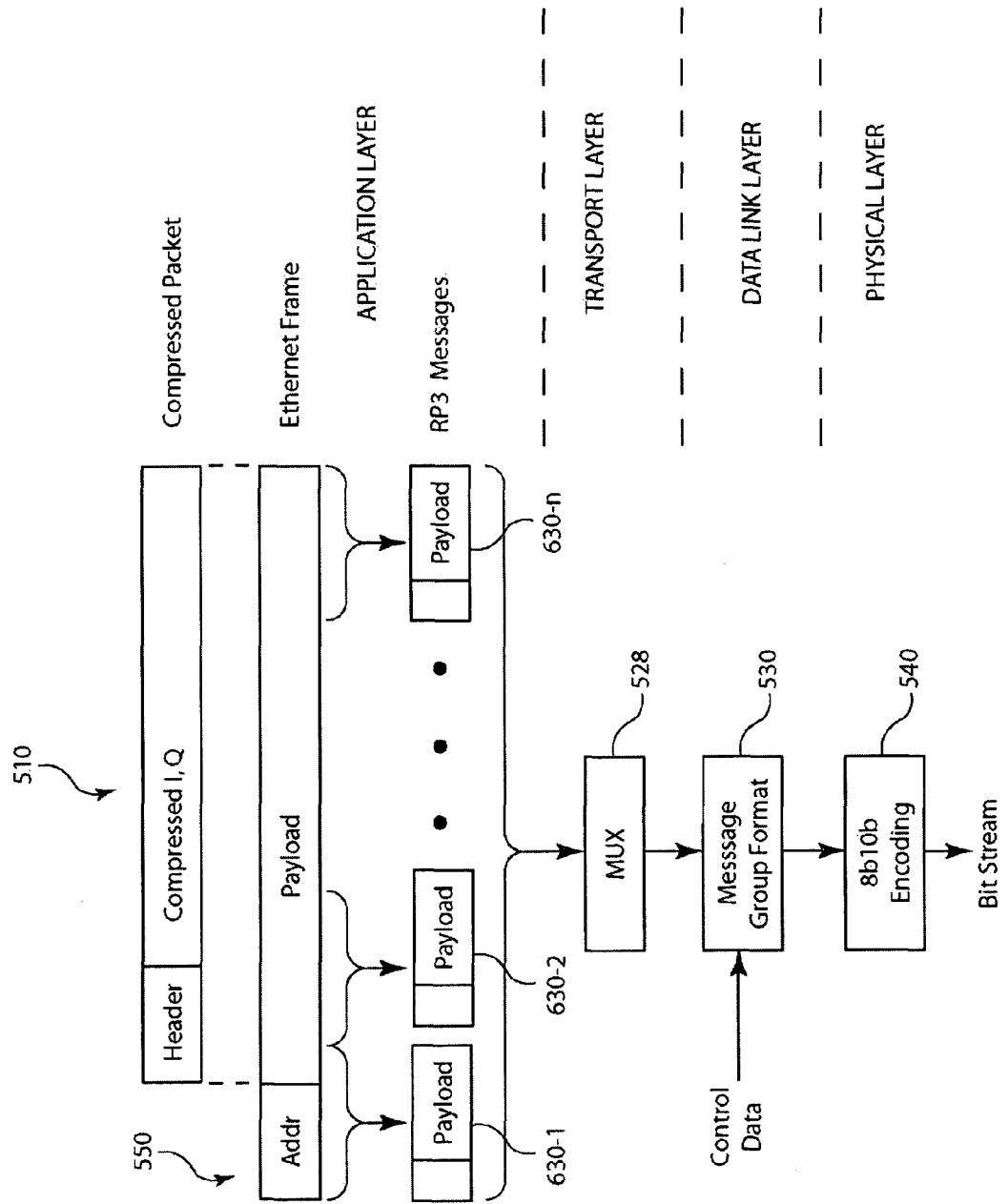
FIG. 6 illustrates an example of mapping a compressed data packet to an Ethernet MAC frame and then to RP3 messages.

Since OBSAI supports the Ethernet data type, compressed data packets can be mapped into Ethernet frames that are then mapped to RP3 messages. For the BTS connected to multiple RRUs, the RP3-01 protocol specifies mapping Ethernet MAC frames to consecutive RP3 messages along with control data. Ethernet MAC frame sizes are between 64 bytes and 1518 bytes, with 14 bytes for the header and payload sizes between 46 bytes and 1500 bytes. FIG. 6 shows an example of mapping a compressed data packet to Ethernet MAC frames and then to RP3 messages. At the application layer, the compressed data packet 510 is mapped to the payload portion of an Ethernet MAC frame 550. The contents of the Ethernet MAC frame 550 are then mapped to the payload portion of several RP3 messages 630-1 to 630-n. The functions of multiplexing at the transport layer, formation of message groups at data link layer and the 8b10b encoding at the physical layer proceed as described with respect to FIG. 5. For convenient mapping of compressed data to Ethernet MAC frames, the BLOCK_SIZE for compressed data can be any multiple of 4. The table in FIG. 7 gives three numerical examples for mapping compressed data to Ethernet payloads. The bits per sample indicate the number of bits allotted to each I sample and each Q sample. The assumed BLOCK_SIZE and resulting number of payload bytes per Ethernet MAC frame are listed. For uncompressed samples having 12-bit and 14-bit bits per sample (I or Q), the samples per payload value of 750 assume no bit-packing The BLOCK_SIZE for compressed data can be selected by a user to achieve a desired Ethernet payload size.

The OBSAI standard also supports custom data types for RP3 messages. Since type values 01111-11111 are not assigned, the user can assign one of the type values to a custom message that contains compressed data in the payload portion. Referring to FIG. 5, the type field 524 can be assigned the type value corresponding to the custom message. The user can specify additional parameters for message groups containing custom messages, including the number of message per message group (M_MG), the minimum number of message groups per frame (N_MG) and the number of idle codes per message group (K_MG).

The CPRI standard defines a basic frame having a duration of 260.416667 nanoseconds, or 1/3.84 MHz. The basic frame includes 16 words, one word contains control data and the remaining 15 words, referred to as the IQ data block, contain baseband I,Q signal samples. The word length in bits depends on the data transfer rate of the link. The IQ data block size in bits equals 15 times the word length, so capacity of a basic frame depends on the data transfer rate. The specified data transfer rates are 614.4 Mbps, 1228.8 Mbps, 2457.6 Mbps and 3072.0 Mbps with respective word lengths of 8, 16, 32 and 40 bits. The CPRI standard allows varying sample widths for signal samples for the downlink (8 to 20 bits per sample) and the uplink (4 to 20 bits per sample). The sample width is the number of bits per sample. Each I,Q signal sample consists of one I sample having the sample width and one Q sample having the same sample width. The sample widths are determined at the application layer. The flexibility of sample width is beneficial for accommodating compressed samples. The CPRI protocol organizes signal data into packets called AxC containers. Each AxC container includes I and Q samples corresponding to one antenna-carrier (AxC). The AxC corresponds to data provided to or received via one carrier of one independent antenna element. The AxC container holds the I,Q samples for the duration of one UMTS chip. For WiMax, the AxC container holds the I,Q samples and sometimes additional stuffing bits. The AxC containers from several different AxCs are multiplexed together to form AxC container groups. The AxC container groups are mapped to the I,Q data block of the basic frame.

Figure 8:
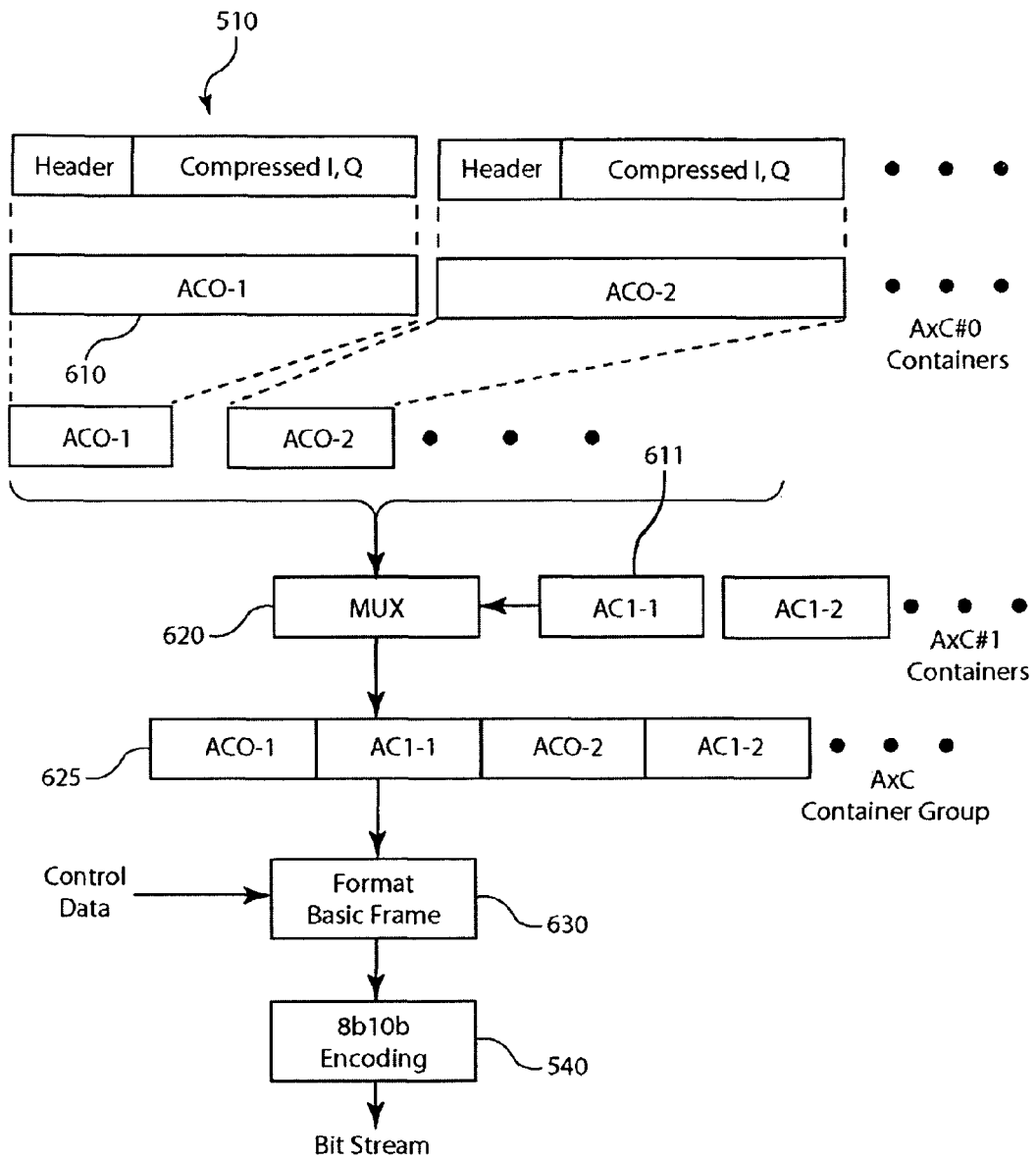
FIG. 8 shows an example of mapping compressed data packets for transfer according to the CPRI protocol.

FIG. 8 shows an example of mapping compressed data packets for transfer according to the CPRI protocol. Each compressed data packet 510 from the same antenna-carrier is mapped to an AxC container 610. The consecutive AxC containers AC0-1 and AC0-2 correspond to a first antenna-carrier, AxC#0. Each AxC container 611 holds a compressed data packet from a second AxC, AxC#1. The multiplexer 620 multiplexes the AxC containers from the two antenna-carriers to form an AxC container group 625. The basic frame formatter 630 forms a basic frame having a number of AxC container groups in the IQ data block and adding the control word. The 8b10b encoder 540 applies an 8b10b code to each byte of data in the basic frame. Referring to FIG. 4, for CPRI systems, the multiplexers 420 and 421 perform the functions described with respect to FIG. 8 on compressed data packets 510 output from each group of compressors 120i and 130i. The demultiplexers 440 and 441 perform the inverse operations, including 8b10b decoding, demultiplexing AxC containers from the AxC container groups and extracting the compressed data packets 510 from the AxC containers. The CPRI standard supports between 4 and 24 AxCs per RE. The CPRI standard also specifies oversampling the received analog signal by factors of 2 to 4 for the UTRA/FDD uplink. Compressing the oversampled signals reduces signal redundancy. Compression could enable the use of fewer media connections (cables) between RECs and REs, lowering physical connection costs and allowing existing CPRI links to support additional AxCs.

The serial data transfer link 430 can be implemented using several types of cabling or using wireless transmission. For long distances single mode or multi-mode fiber optic cabling may be used, while for shorter links CAT5/6, other twisted pair cabling, or coax may be used. Multiple RF bands transmitted as digital data streams can be time multiplexed on optical fiber links.

When the baseband signals are oversampled, compression reduces the redundancy and improves data transfer efficiency. Oversampling is indicated when the number of samples per symbol or chip is greater than one. The oversampling ratio is the ratio of the sample rate to the symbol rate or chip rate. When the oversampling ratio is greater than one, the signal is oversampled. For example, the CPRI standard specifies sampling the received analog signal with an oversampling ratio 2 or 4 samples per chip for the UTRA/FDD uplink. For another example, the OBSAI standard specifies oversampling the uplink WCDMA signal by an oversampling ratio of 2 samples per chip In many cases, lossy compression can be applied to the signal samples while maintaining system quality metrics. For lossless compression, the decompressed signal samples are identical to the original signal samples. For lossy compression, the decompressed signal samples are approximations of the original signal samples. System quality metrics typically include composite error vector magnitude (cEVM), peak code domain error (PCDE), spectral emissions mask (SEM), adjacent channel leakage ratio (ALCR), bit error rate (BER) and block error rate (BLER). The oversampling and/or sample widths of the signal samples may be greater than necessary to meet system requirements for signal quality. Lossy compression can provide a greater reduction in data transfer capacity while the important metrics of signal quality are preserved.

In the commonly owned U.S. Pat. No. 7,009,533 B1 (the '533 patent), entitled "Adaptive Compression and Decompression of Bandlimited Signals", dated Mar. 7, 2006, the present inventor describes algorithms for compression and decompression of certain bandlimited signals. The compression methods described herein adapts those algorithms for the present application to signal samples from the various configurations of a BTS. The compression method applied depends on characteristics of the signal samples, including center frequency, sample rate and signal-to-noise ratio (SNR).

Systems that generate baseband signal samples for transfer over the serial data links include those compatible with OBSAI or CPRI and configurations of the general BTS where the signal samples are centered at 0 Hz. The compression methods applied to baseband signal samples include block floating point encoding and computing first or higher order derivatives of the signal samples followed by block floating point encoding. Huffman or other types of encoding can be alternatives to block floating point encoding. For signal samples that are sampled at one sample per chip or symbol, the preferred method is block floating point encoding of the signal samples. For example, the OBSAI compatible W-CDMA signal samples for downlink from the baseband module to the RF unit have one sample per chip. The block floating point encoding is applied to the I samples and, independently, to the Q samples, to form the compressed samples.

The preferred block floating point encoding has the following steps for BLOCK_SIZE samples, each BLOCK_SIZE divided into groups of N_group samples:

For the first group of samples, where S is the original number of bits per sample:
1) Determine the exponent (base 2) for the sample with the maximum magnitude, such as by calculating the $\log_2$ of the maximum magnitude. This indicates the number of bits per encoded sample in the group, or n_exp(0).
2) Absolute encode the exponent n_exp(0) of the first group using S bits.
3) Encode the N_group samples using n_exp(0) bits per sample.

For the $i^{th}$ group of N_group samples
4) Determine the $i^{th}$ exponent (base 2) for the sample with the maximum magnitude, which indicates the number of bits per encoded sample in the $i^{th}$ group, or n_exp(i);
5) Differentially encode the $i^{th}$ exponent by subtracting n_exp(i) from n_exp (i-1) to determine the first token in the $i^{th}$ group of encoded samples.
6) Encode the $i^{th}$ group of N_group samples using n_exp(i) bits per sample.

For the first group of samples in the BLOCK_SIZE samples, the exponent n_exp(0) is absolute encoded. For example, the exponent n_exp(0) can be encoded as follows, where S is the original number of bits per sample:
 a. 0: n_exp(0)=0 (all 4 sample values are zero)
 b. 1: n_exp(0)=2 (2 bits per sample)
 c. 2: n_exp(0)=3 (3 bits per sample)
 d. etc. until S−1: n_exp(0)=S (S bits per sample)

For the $i^{th}$ group, the exponent n_exp(i) is differentially encoded using a prefix code, where no codeword is the prefix of another codeword. The preferred differential encoding is as follows:
 1. Calculate difference: e_diff=n_exp(i)−n_exp(i−1)
 2. Encode e_diff as follows:
  a. 0: e_diff=e(i)−e(i−1)
  b. 101: e_diff=+1
  c. 110: e_diff=−1
  d. 1001: e_diff=+2
  e. 1110: e_diff=−2
  f. Etc.

Another compression alternative for baseband signal samples is calculating differences followed by encoding. Calculating first or higher order differences of the signal samples can result in difference samples having smaller magnitudes than the original signal samples. Encoding the difference samples can result in greater compression than encoding the samples themselves. Calculating the differences of consecutive samples in each BLOCK_SIZE number of samples is followed by block floating point encoding of the difference samples, as described above. Alternatively, Huffman encoding or other encoding can be applied to the difference samples.

Compression can also include reducing the amplitudes of signal samples. This is a form of lossy compression. Attenuating the signal samples by an attenuation factor reduces the effective sample width. The attenuated signal samples can be encoded by block floating point or other encoding. Alternatively, the first or higher order differences of the attenuated signal samples can be calculated prior to encoding. For decompression, the amplitudes of the decompressed samples can be increased by the inverse of the attenuation to restore the original sample width.

The optimum compression for the wireless communication signals that meets system quality requirements for the BTS can be determined in advance. The compression alternatives can include lossless and lossy compression. Control parameters based on the modulation type, sample rate (or oversampling ratio), bandwidth and sample width can be used to configure the compression and decompression operations. The control parameters for the various types of signals served by the BTS can be determined by testing. The control parameters can then be set based on the modulation type. For example, in the OBSAI standard the type field in the RP3 message indicates the signal type, or modulation type. Since the OBSAI standard specifies the sample rate and sample width based on the modulation type, a compression/decompression controller can use the type information to select the corresponding control parameters for the compressor/decompressor. The user can also select lossless or lossy modes. For instance, selecting an attenuation parameter for reducing the amplitudes of the signal samples will result in lossy compression. The user can also select a fixed-rate lossy mode, where the bit rate of the compressed samples is constant.

Figure 9A:
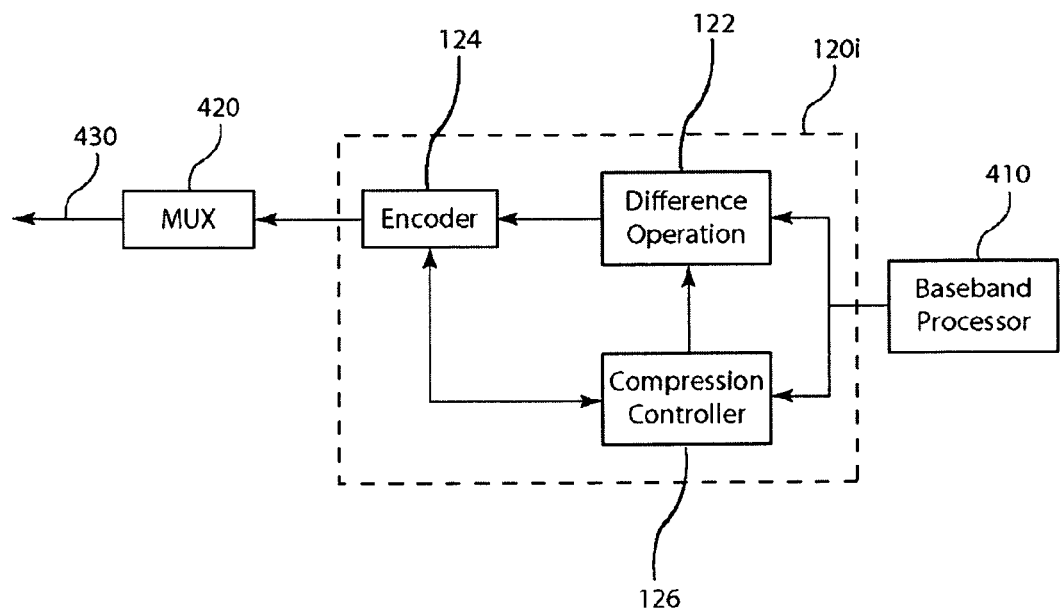
FIG. 9a is a block diagram of the compressor at the baseband unit.
Figure 9B:
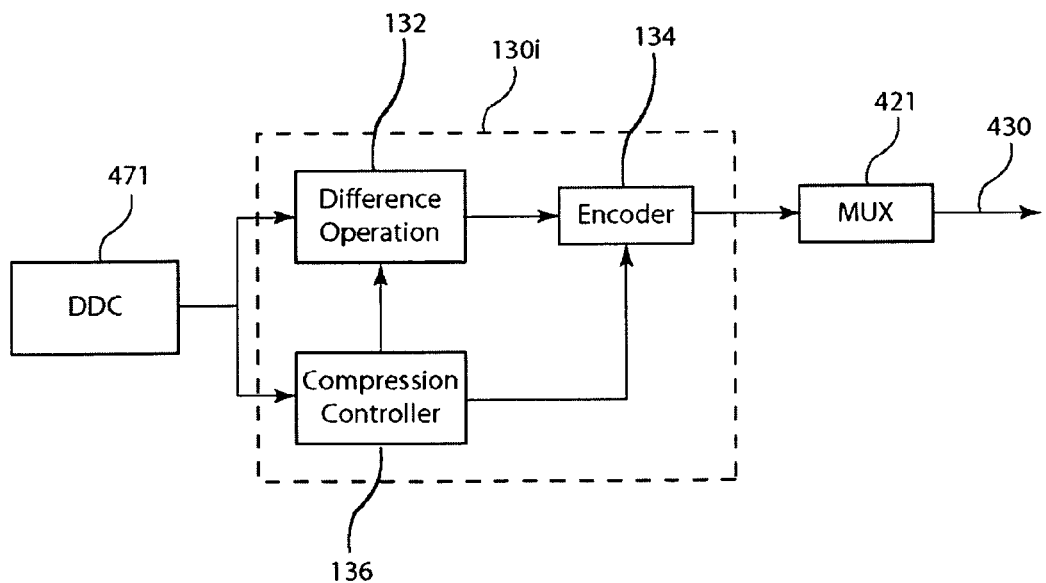
FIG. 9b is a block diagram of the compressor at the RF unit.

FIGS. 9a and 9b show block diagrams of the compressors 120i and 130i of FIG. 4. The compressor 120i receives input from the baseband processor 410 and the compressor 130i receives input from the DDC 471. The compressors 120i/130i include the respective compression controllers 126/136 that provide control parameters for the respective difference operators 122/132 and encoders 124/134. The application layer for the base station processor and the RF unit includes the air interface applications for the types of wireless signals. For example, in the OBSAI standard, the application layer determines the signal type, or modulation type, and encodes it for the type field of the RP3 message. The compression operations of the present invention are added to the conventional operations of the application layer, so information on the modulation type is available to the compression controllers 126/136. The compression controllers 126/136 use the modulation type information to determine control parameters for the respective difference operators 122/132 and encoders 124/134. The control parameters for the difference operators 122/132 can select first, second or higher order differences, or bypass the difference operations. The control parameter for the encoders 124/134 can indicate parameters for the block floating point encoder, such as number of bits S, the group size and BLOCK_SIZE.

Figure 10A:
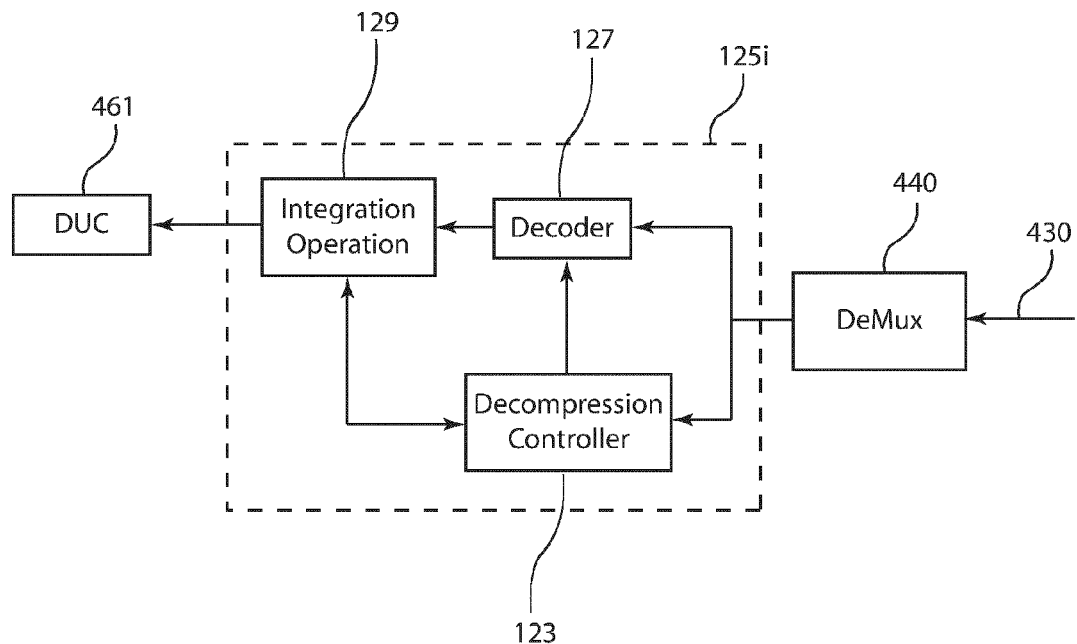
FIG. 10a is a block diagram of the decompressor at the RF unit.
Figure 10B:
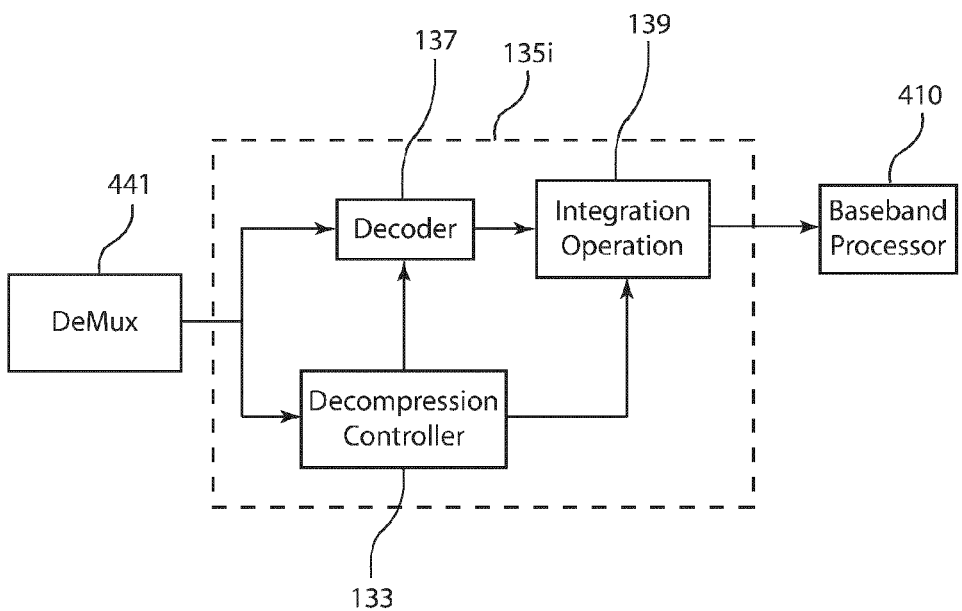
FIG. 10b is a block diagram of the decompressor at the baseband unit.

FIGS. 10*a* and 10*b* are block diagrams of the decompressors 125*i* and 135*i* of FIG. 4. The decoders 127/137 invert the operations of the encoders 124/134 to form decoded samples. For example, the decoders 127/137 perform block floating point decoding, Huffman decoding or other decoding. The integration operators 129/139 add the decoded difference samples to invert the first or higher order differencing performed for compression. If differencing was not performed for compression, the integration operators 129/139 would be bypassed. The decompression controllers 123/133 provide control parameters to the respective decoders 127/129 and integration operators 129/139. The decompression controllers 123/133 can extract control data from the header of the compressed data packet to determine the control parameters. The decompression controllers 123/133 can also use modulation type information to determine the appropriate decompression configuration. The modulation type information can be included in the header. For OBSAI the modulation type can be determined from the type field of the RP3 messages.

The compression and decompression described above can also be applied to signal samples having non-zero center frequencies. For example, the compressors 120/130 and decompressors 125/135 of FIGS. 1*a* and 1*b* for the general BTS architecture can apply block floating point encoding or differencing followed by encoding, as described above, to signal samples centered at IF or RF. Compression can also include attenuating the signal samples as described above. However, the alternative compression algorithms described below may achieve better compression for signal samples having non-zero center frequencies. The sample rate is represented by $f_S$ and the sample interval is the inverse of the sample rate, $1/f_S$. The signal samples can represent multiple channels of signal data centered at an RF or converted to an IF in a block, or band, of frequencies. The compressors 120/130 and decompressors 125/135 process the block of frequencies as a unit.

Figure 11:
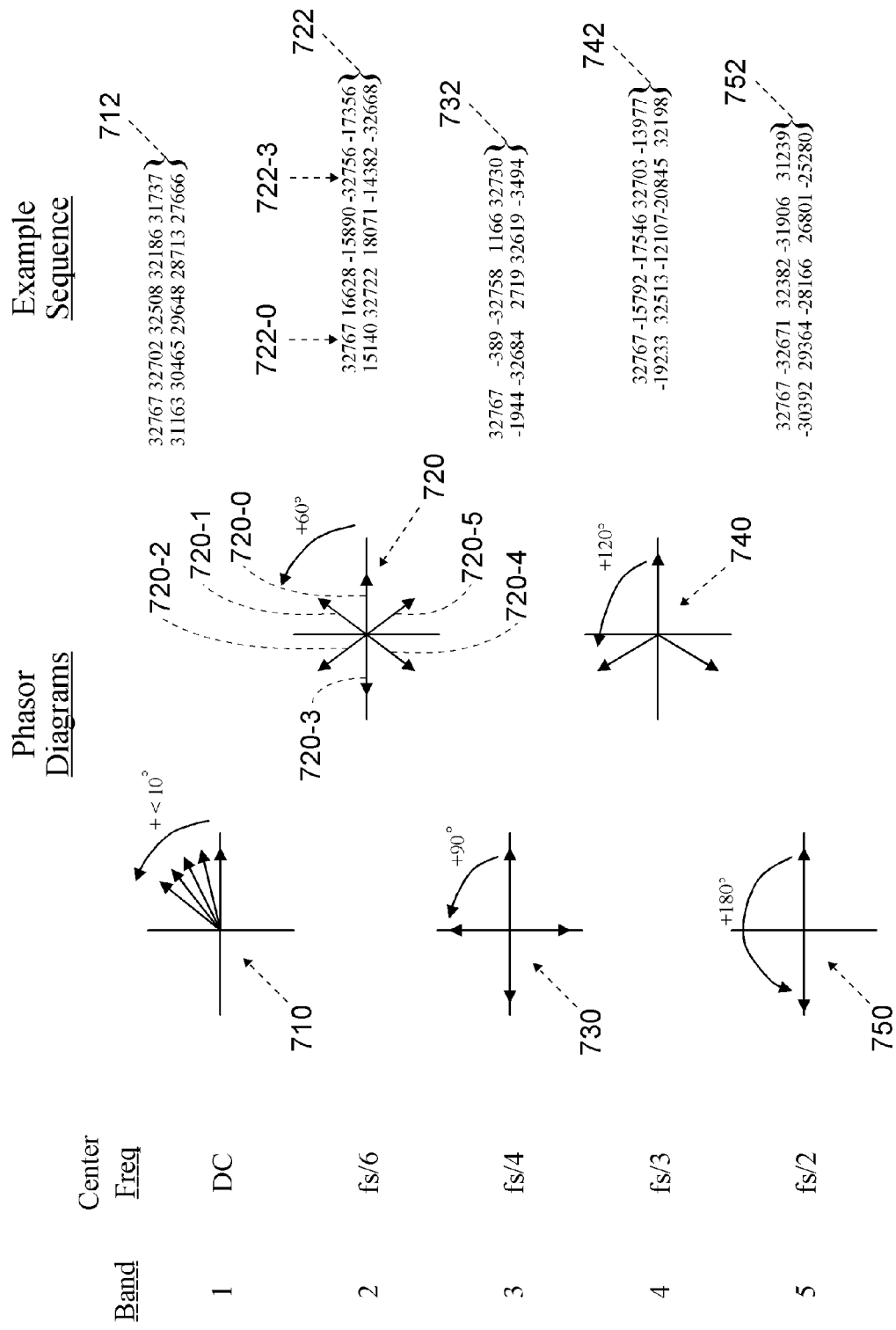
FIG. 11 gives examples that illustrate principles underlying alternatives for compressing signal samples with different center frequencies.

FIG. 11 gives examples that illustrate principles underlying alternatives for compressing signal samples with different center frequencies. Beginning with the example of a baseband signal, corresponding to row labeled "Band 1" in FIG. 11, the center frequency is near DC (0 Hz) and the phase increase between consecutive samples is less than 10 degrees. The first phasor diagram 710 shows that since the phase changes between consecutive samples are small, the magnitudes of the differences of consecutive samples will be relatively small compared to the magnitudes of the samples themselves. The first example sequence 712 corresponds to samples of a Band 1 baseband signal. Since the differences between consecutive samples are small relative to the sample magnitudes, calculating first or higher order differences, or differential encoding, creates difference samples with smaller data widths than the original samples. Compression using differential encoding approach is effective for the baseband (Band 1) example. This corresponds with the compression approach described with respect to FIGS. 9*a* and 9*b* for baseband signal samples.

FIG. 11 also gives examples of sampled signals where the center frequency is above DC, but below the Nyquist frequency, $f_S/2$. For Band 2, the center frequency is near $f_S/6$ and the phase increase between consecutive samples is about 60 degrees. The second phasor diagram 720 shows that pairs of samples separated by 180 degrees, or three sample intervals, have similar magnitudes but opposite polarities, as illustrated by pairs of samples (720-0, 720-3), (720-1, 720-4) and (720-2, 720-5). Inverting one of the samples in the pair [or multiplying by (−1)] provides a close estimate of the other sample in the pair. The second example sequence 722 also shows that samples separated by three sample intervals have similar magnitudes and opposite signs. For example, the value of sample 722-0 is 32767 and the value of sample 722-3 is −32756. For Band 2, operations on pairs of samples separated by three sample intervals produce modified samples with smaller data widths. The operation of adding the samples in the pair together produces modified samples having smaller data widths that can be encoded more efficiently.

For the example of Band 3 in FIG. 11, the center frequency is near $f_S/4$ and the phase increase between consecutive samples is about 90 degrees. The third phasor diagram 730 shows that samples separated by 180 degrees, or 2 sample intervals, have similar magnitude and opposite polarity. The third example sequence 732 also shows that every other sample has similar magnitudes and opposite polarities. For Band 3, adding together every other sample will result in modified samples with smaller data widths that can be encoded more efficiently than the original samples.

For the example of Band 4 in FIG. 11, the center frequency is near $f_S/3$ and the phase increase between consecutive samples is about 120 degrees. The fourth phasor diagram 740 shows that samples separated by 360 degrees, or 3 sample intervals, will have similar magnitudes. The fourth example sequence 742 shows that every third sample has similar magnitudes. In this case, forming a difference between samples separated by 3 sample intervals will give a modified sample with a smaller data width that can be encoded more efficiently than the original samples.

For the example of Band 5 in FIG. 11, the center frequency is $f_S/2$ and the phase increase between consecutive samples is about 180 degrees. The fifth phasor diagram 750 shows that samples separated by 180 degrees, or one sample interval, will have similar magnitudes but opposite polarities. The fifth example sequence 752 shows consecutive samples have similar magnitudes and opposite polarities. In this case, adding two consecutive samples will form a modified sample with a smaller data width that can be encoded more efficiently than the original samples.

The above examples described for FIG. 11 show that magnitude reduction can be achieved by performing operations such as addition (or inversion followed by subtraction) or subtraction (or inversion followed by addition) on signal samples that are separated by 1, 2 or 3 sample intervals, depending on the ratio of the sample rate to the center frequency. The resulting modified samples are then encoded to form compressed samples. Similar operations can be applied to samples that are separated by four or more sample intervals, depending on the ratio of the center frequency to the sample rate, to produce modified samples with smaller data widths than the original signal samples.

Figure 12:
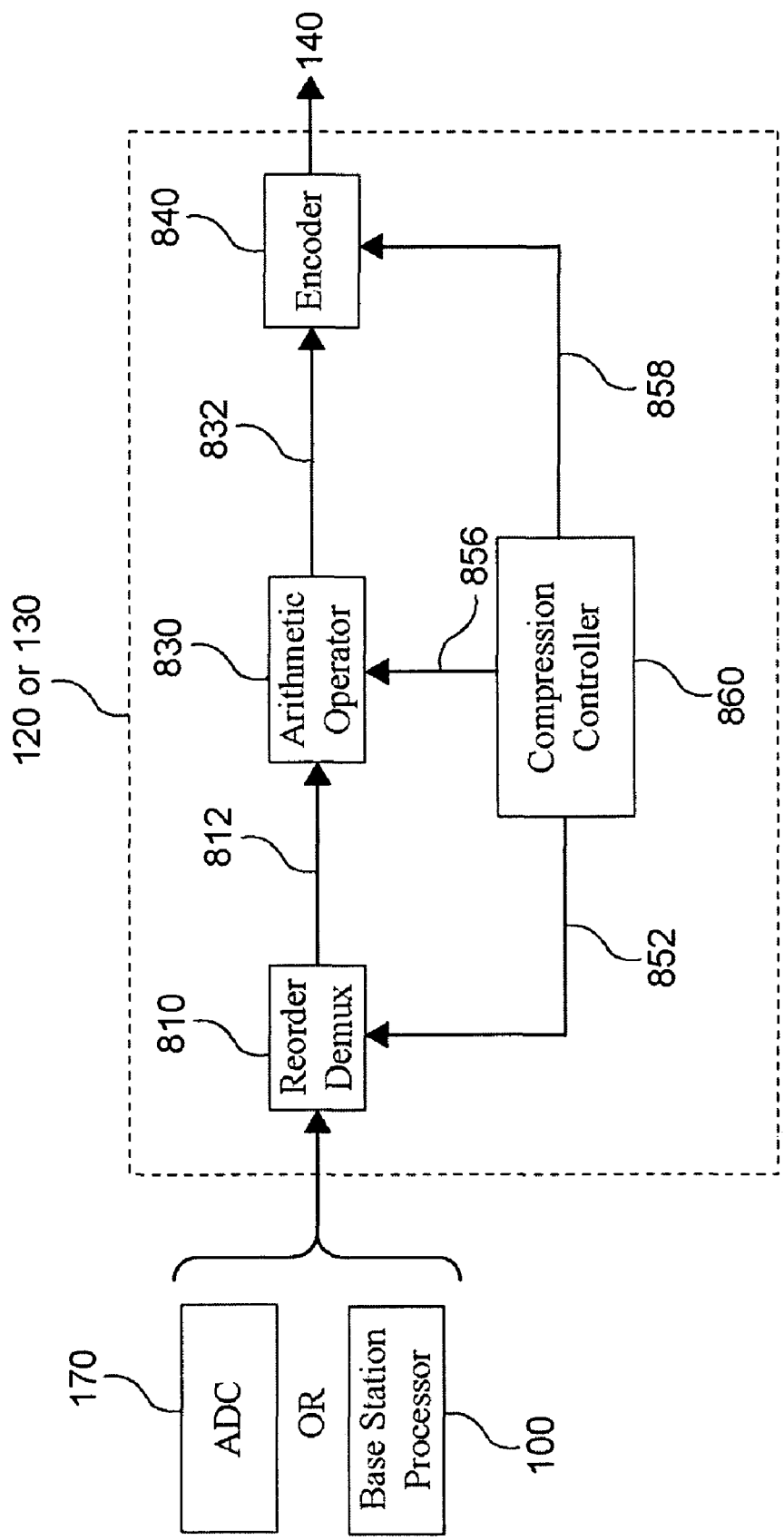
FIG. 12 is a block diagram of a compression algorithm based on the center frequency signal samples.

FIG. 12 is a block diagram of a compression algorithm based on the center frequency of the signal samples. The ADC 170 or the base station processor 100 provide I and Q signal samples to the respective compressors 120 or 130. The reorder demux 810 selects signal samples so that selected samples are separated by the appropriate number of sample intervals according to compression control parameter 852 to form demultiplexer output 812. Arithmetic operator 830 performs addition or subtraction operations on pairs of demultiplexer output samples 812 according to compression control parameter 856 to form modified samples 832. Arithmetic operator 830 can also be configured to perform higher order differences on the demultiplexer output samples 812. The encoder 840 encodes the modified samples 832 to form compressed signal samples. The encoder 840 applies block floating point encoding, Huffman encoding or other encoding. The compressed signal samples are packed and formatted for transfer over the serial data link 140.

Figure 13:
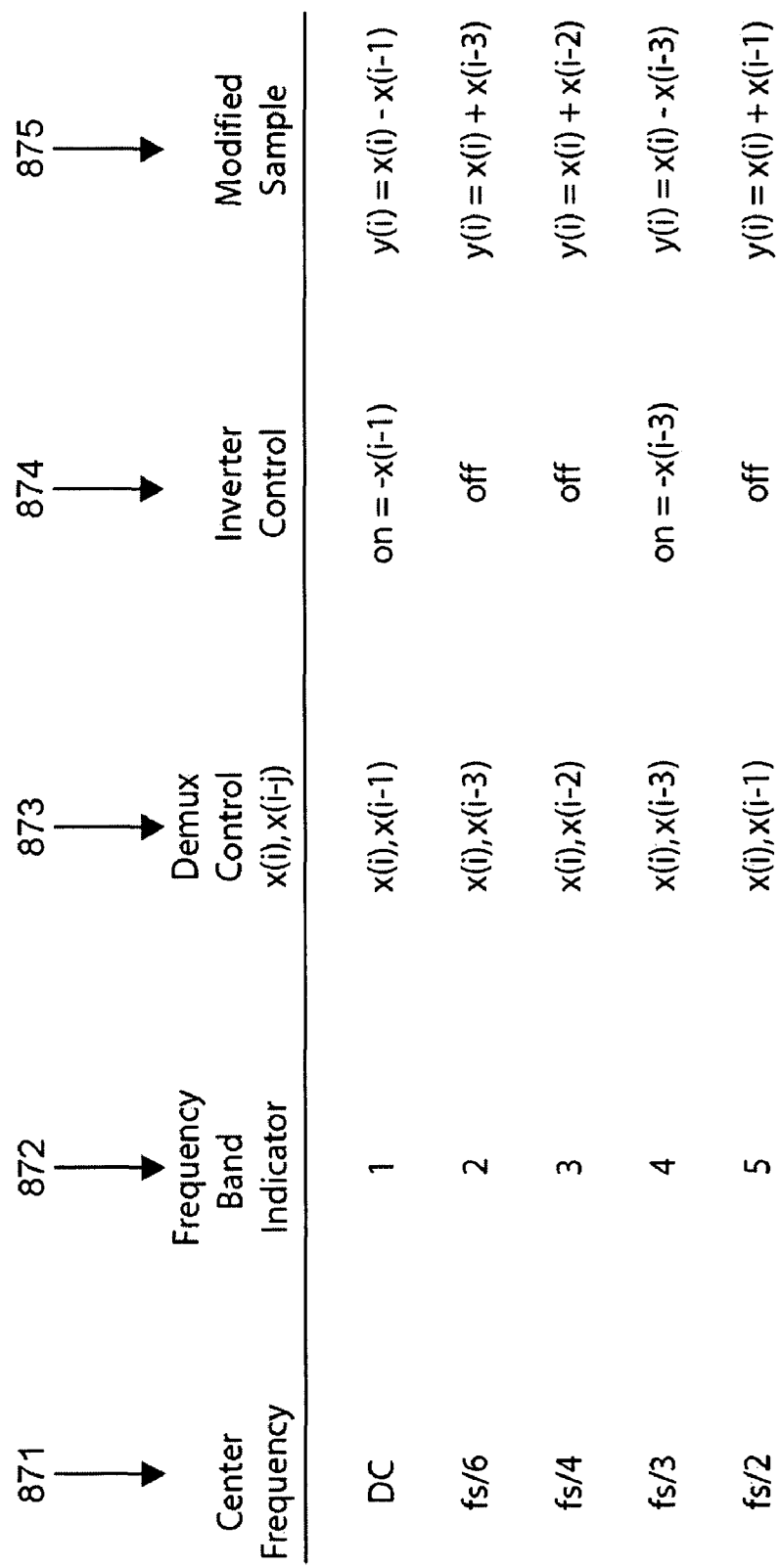
FIG. 13 shows the operations that produce modified sample based on the center frequency.

The compression controller 860 provides control parameters to the compressor elements based on the ratio of the sample rate to the center frequency of the signal samples. The reorder demux 810 and arithmetic operator 830 respond to the compression control parameters 852 and 856, respectively, to perform the appropriate operations. FIG. 13 shows the operations that produce modified samples 832 based on the center frequency. The first column 871 gives the possible center frequencies for this example. The second column 872 gives a corresponding frequency band indicator for each center frequency. The indicators can be used as parameters for compression control parameters 852 and 856. The third column 873 gives the different separations of samples x(i) and x(i-j) at reorder demux output 812 that would be produced in accordance with compression control parameter 852. The fourth column 874 shows the result of selecting the arithmetic operations of addition or subtraction in accordance with compression control parameter 856. When the inverter is "on" the delayed sample, x(i-j) is subtracted. The fifth column 875 shows the mathematical results of the arithmetic operator 830 that produce the modified samples 832, or y(i). The compression controller 860 also provides control of the encoder 840. The compression control parameter 858 can indicate a parameter for block floating point encoding or other encoding technique.

FIG. 14 gives the sums or differences of signal samples x(i) and x(i-j) for the examples of FIG. 11 calculated as described with respect to of FIGS. 12 and 13 for different center frequencies. The example sequences of signal samples are the same as those of FIG. 11. The samples in the DIFF rows in example sequences 912 and 942 and the SUM rows in example sequences 922, 932 and 952 have substantially lower magnitudes than the corresponding signal samples, or x(i). The DIFF samples and the SUM samples are examples of modified samples 832 that are input to encoder 840 in FIG. 12.

For example, consider a multicarrier signal comprising four 5 MHz channels for a total bandwidth of 20 MHz. The 20 MHz multicarrier signal is centered at an IF of 30.72 MHz and is sampled at a sample rate ($f_S$) of 122.88 MHz. The IF corresponds to $f_S/4$ so that the modified samples are represented by the equation, $$y(i)=x(i)+x(i-2) \quad (1)$$

as indicated in FIG. 13. Referring to FIG. 12, the reorder demux 810 rearranges the samples into two sequences, one with the odd-indexed samples and one with the even-indexed samples, so the samples in each sequence are separated by two sample intervals. The arithmetic operator 830 adds the samples in each sequence in accordance with equation (1) to form the modified samples 832. The encoder 440 applies block floating point encoding to the modified samples to form the compressed samples.

The compressed samples are packed to form compressed data packets that include control data in a header, as described above. The compressed packets can be further formatted in accordance with a protocol for transfer over the serial data link 140. The serial data link 140 can be a custom link or an industry standard link. Depending on the type of link, formatting operations can include 8b10b encoding, insertion into Ethernet MAC frame or other formatting.

Figure 15:
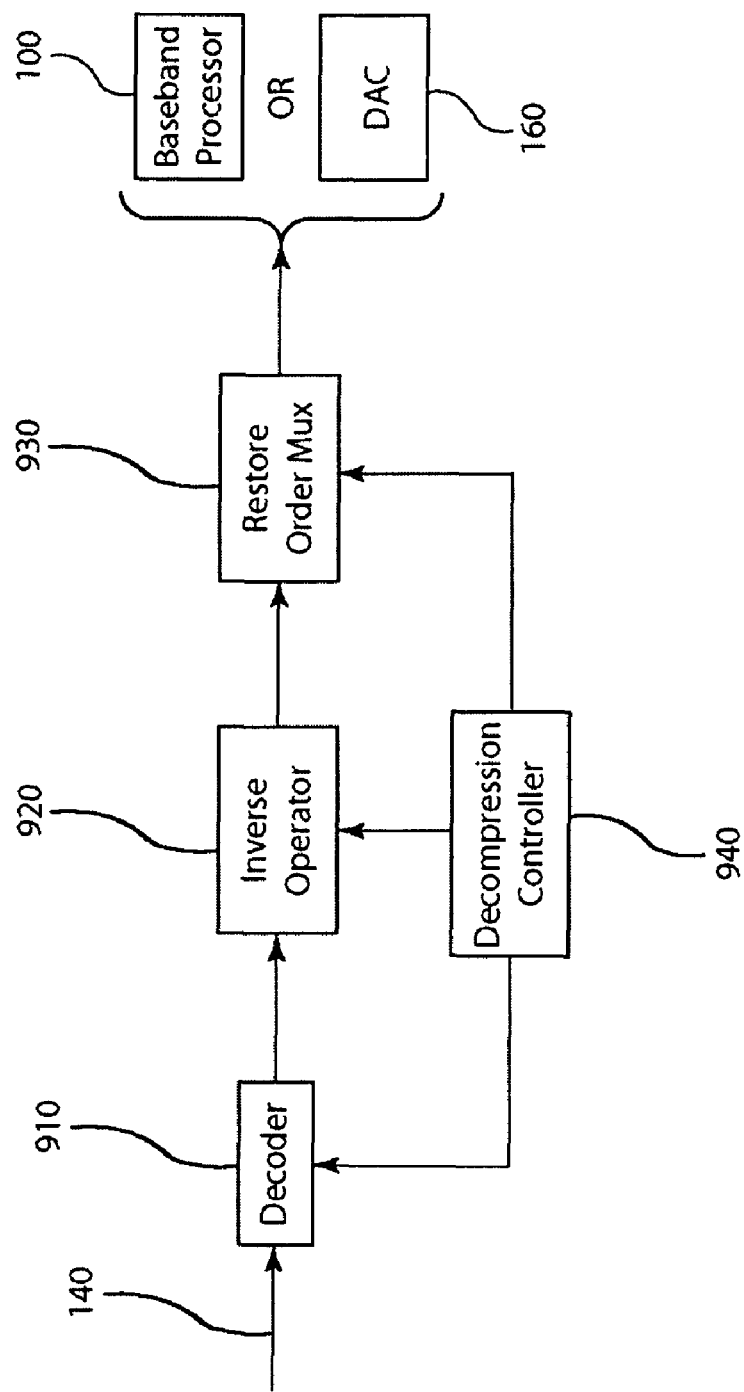
FIG. 15 is a block diagram of the operations performed by the decompressor.

FIG. 15 is a block diagram of the operations performed by the decompressors 125/135. The compressed packets are received by the decoder 910 from the data link 140. The decoder 910 unpacks and performs decoding operations, for instance block floating point decoding, on the compressed data, to form decoded modified samples. The inverse arithmetic operator 920 performs the inverse operations to the arithmetic operator 830 to reconstruct the signal samples from the decoded modified samples. The multiplexer 930 restores the original order of the decompressed signal samples. At the RF unit, the decompressed signal samples are converted to an analog signal and processed for transmission. At the base station processor, the normal signal processing operations are applied to decompressed signal samples.

The compression methods described above can be configured to produce lossless or lossy compression. Depending on system parameters, it can be possible to obtain the specified bit error rates (BER), or other quality metric, for data transfer when lossy compression is applied to the signal samples. Lossy compression can provide additional resource savings within the BER limitation. One approach for lossy encoding is to reduce the data width, or dynamic range, of the samples to be compressed. A programmable attenuator can attenuate the signal samples to reduce the data width prior to the other compression operations of compressors 120/130 and 120i/130i. Alternatively, programmable shifters can shift out one or more least significant bits from the signal samples, also reducing the data width. In another alternative, arithmetic operator 830 or encoder 840 can eliminate one or more least significant bits. Each of these alternatives for lossy encoding can be controlled by the compression controller 860. Additional alternatives for control of lossless and lossy compression can be based on a desired bit rate for compressed signal samples or a desired signal quality, such as SNR or BER, of the decompressed signal.

In the examples of FIGS. 1 through 4, the BTS includes compression and decompression on both the forward link from the base station processor to the RF unit and the reverse link from the RF unit to the base station processor. Alternative embodiments include providing compression and decompression in one direction only. For the forward link, or down link, only the base station processor includes a compressor and only the RF unit includes a decompressor. For the reverse link, or up link, only the RF unit includes a compressor and only the base station processor includes a decompressor.

Implementation alternatives for the compressor and decompressor include programmable processors and application specific integrated circuits (ASIC). The programmable processors include software/firmware programmable processors such as computers, digital signal processors (DSP), microprocessors (including microcontrollers) and other programmable devices, and hardware programmable devices such as complex programmable logic devices (CPLD), field programmable gate arrays (FPGA). Depending on the type of programmable processor, the program implementing the compression and decompression operations are represented by software, firmware, netlist, bitstream or other type of processor executable instructions and data. Subsystems that implement the compressor and decompressor can be integrated into devices that perform other functions of the RF unit or base station processor. Implementations of compression or decompression can be performed in real time, that is, at least as fast as the sample rate of the ADC or DAC. Compression and decompression operations include multiplexing operations, inversion operations and simple arithmetic operations including addition, subtraction and shifting.

While the preferred embodiments of the invention have been illustrated and described, it will be clear that the invention is not limited to these embodiments only. Numerous modifications, changes, variations, substitutions and equivalents will be apparent to those skilled in the art, without departing from the spirit and scope of the invention, as described in the claims.

I claim:

1. In a base transceiver system of a wireless communication network, a method for transferring communication data for transmission to wireless subscribers, including generating signal samples of a plurality of baseband antenna-carrier channels in a baseband processor for transfer to a radio frequency (RF) unit over a serial data link, the plurality of baseband antenna-carrier channels including at least one particular baseband antenna-carrier channel comprised of signal samples for a composite of signals to be transmitted to multiple wireless subscribers, each signal sample associated with one of the plurality of baseband antenna-carrier channels, wherein each signal sample includes an in-phase (I) sample and a quadrature (Q) sample, the RF unit including a digital up converter (DUC) that upconverts a sequence of signal samples of the plurality of baseband antenna-carrier channels to a plurality of upconverted antenna-carrier channels to form a single upconverted digital signal comprised of upconverted signal samples from the plurality of upconverted antenna-carrier channels, and a digital to analog converter (DAC) that converts the upconverted digital signal to an analog signal, wherein the RF unit is coupled to an antenna to transmit the analog signal, the analog signal representing the plurality of upconverted antenna-carrier channels, the method comprising:
compressing the signal samples corresponding to each baseband antenna-carrier channel, including the at least one particular baseband antenna-carrier channel, to form compressed samples in accordance with a compression control parameter wherein each compressed sample includes a compressed I sample and a compressed Q sample, wherein the compressed samples for the particular baseband antenna-carrier channel represent the composite of signals to be transmitted to the multiple wireless subscribers;
formatting the compressed samples for transfer over the serial data link;
transferring the compressed samples over the serial data link to the RF unit;
receiving the compressed samples at the RF unit; and
decompressing the compressed samples in accordance with a decompression control parameter to form decompressed signal samples corresponding to each baseband antenna-carrier channel, wherein each decompressed sample includes a decompressed I sample and a decompressed Q sample, wherein the decompressed signal samples for the at least one particular baseband antenna-carrier channel reconstruct the composite of signals to be transmitted to the multiple wireless subscribers, and wherein the decompressed signal samples are provided to the DUC for forming the upconverted digital signal.

2. The method of claim 1, wherein the step of compressing further comprises:
applying block floating point encoding to the signal samples to form the compressed samples.

3. The method of claim 1, wherein the step of compressing further comprises:
calculating first or higher order differences of the signal samples to form a sequence of difference samples in accordance with the compression control parameter; and
encoding the difference samples to form the compressed samples.

4. The method of claim 3, wherein the step of encoding includes block floating point encoding.

5. The method of claim 1, wherein the compression control parameter is based on one or more characteristics of the signal samples.

6. The method of claim 5, wherein the characteristic includes at least one of a sample rate, a sample width, a bandwidth and a modulation type of the signal samples.

7. The method of claim 1, wherein the step of compressing is performed in a compression subsystem implemented in programmable processor, a field programmable gate array (FPGA) or an application specific integrated circuit (ASIC) of the baseband processor.

8. The method of claim 1, wherein the steps of formatting, transferring and receiving are performed in accordance with one of the following industry standards:
an Open Base Station Architecture Initiative (OBSAI) standard; and
a Common Public Radio Interface (CPRI) standard.

9. The method of claim 1, wherein the step of formatting further comprises:
mapping a sequence of the compressed samples corresponding to each baseband antenna-carrier channel to a sequence of data structures, to form a plurality of sequences of data structures for the plurality of baseband antenna-carrier channels; and
multiplexing the plurality of sequences of data structures corresponding to the plurality of baseband antenna-carrier channels to form a sequence of multiplexed data structures representing the compressed samples for the step of transferring.

10. The method of claim 9, wherein the step of mapping further comprises:
mapping the sequence of the compressed samples corresponding to each baseband antenna-carrier channel to a sequence of Ethernet MAC frames; and
mapping the sequence of Ethernet MAC frames to the sequence of data structures corresponding to each baseband antenna-carrier channel.

11. The method of claim 9, wherein the data structures are formed in accordance with one of the following:
an Open Base Station Architecture Initiative (OBSAI) standard, wherein the data structures are in accordance with a Reference Point 3(RP3) message protocol; and
a Common Public Radio Interface (CPRI) standard wherein the data structures are in accordance with an antenna-carrier (AxC) container protocol.

12. The method of claim 2, wherein the step of decompressing further comprises:
applying block floating point decoding to the compressed samples to form the decompressed signal samples in accordance with the decompression control parameter.

13. The method of claim 3, wherein the step of decompressing further comprises:

decoding the compressed samples to form decoded difference samples; and integrating the decoded difference samples to form the decompressed signal samples.

14. The method of claim 1, wherein the step of decoding further comprises applying block floating point decoding.

15. The method of claim 1, wherein the step of decompressing is performed in a decompression subsystem implemented in a programmable processor, a field programmable gate array (FPGA), an application specific integrated circuit (ASIC) of the RF unit.

16. The method of claim 9, wherein the step of receiving further comprises the following steps:

demultiplexing the sequence of multiplexed data structures to reconstruct the plurality of sequences of data structures corresponding to the plurality of baseband antenna-carrier channels; and extracting the sequence of the compressed samples from the sequence of data structures corresponding to each baseband antenna-carrier channel.

17. The method of claim 10, wherein the step of receiving further comprises the following steps:

demultiplexing the sequence of multiplexed data structures to reconstruct the plurality of data structures corresponding to each baseband antenna-carrier channel;

reconstructing the plurality of Ethernet MAC frames from the plurality of data structures; and extracting the compressed samples corresponding to each baseband antenna-carrier channel from the corresponding plurality of Ethernet MAC frames.

18. The method of claim 1, wherein the base transceiver system includes a plurality of RF units in communication with the baseband processor via a plurality serial data links in a distributed antenna system, wherein the baseband processor transfers the compressed samples over the corresponding serial data link to each RF unit, each RF unit applying the step of decompressing to the compressed samples received from the baseband processor to form corresponding decompressed signal samples, wherein each RF unit provides the corresponding decompressed signal samples to the DUC to form the upconverted digital signal.

19. In a base transceiver system of a wireless communication network, including a radio frequency (RF) unit coupled to an antenna to transmit an analog signal and a baseband processor coupled to the RF unit by a serial data link, the baseband processor providing a plurality of signal samples for a plurality of baseband antenna-carrier channels derived from communication data for transmission to wireless subscribers, each signal sample associated with one of the plurality of baseband antenna-carrier channels, wherein each signal sample includes an in-phase (I) sample and a quadrature (Q) sample, the plurality of baseband antenna-carrier channels including at least one particular baseband antenna-carrier channel comprised of signal samples for a composite of signals to be transmitted to multiple wireless subscribers, the RF unit including a digital up converter (DUC) that upconverts the signal samples of the plurality of baseband antenna-carrier channels to a plurality of upconverted antenna-carrier channels to form a single upconverted digital signal and a digital to analog converter (DAC) that converts the upconverted digital signal to the analog signal, the analog signal representing the plurality of upconverted antenna-carrier channels, an apparatus for data transfer from the baseband processor to the RF unit, comprising:

a plurality of compressors, each compressor compressing signal samples of a corresponding baseband antenna-carrier channel in accordance with a compression control parameter to form compressed samples, wherein each compressed sample includes a compressed I sample and a compressed Q sample, one of the plurality of compressors compressing signal samples of the at least one particular baseband antenna-carrier channel, and wherein the compressed samples for the particular baseband antenna-carrier channel represent the composite of signals to be transmitted to the multiple wireless subscribers;

a formatter coupled to the plurality of compressors and formatting the compressed samples in accordance with a data transfer protocol;

the serial data link coupled to the formatter for transferring the compressed samples to the RF unit;

the RF unit coupled to the serial data link to receive the compressed samples; and a plurality of decompressors at the RF unit, each decompressor receiving the compressed samples of the corresponding baseband antenna-carrier channel and forming decompressed signal samples, wherein each decompressed signal sample includes a decompressed I sample and a decompressed Q sample, wherein the decompressed signal samples for the at least one particular baseband antenna-carrier channel reconstruct the composite of signals to be transmitted to the multiple wireless subscribers, and wherein the decompressed signal samples are provided to the DUC for forming the upconverted digital signal.

20. The apparatus of claim 19, wherein the compressor further comprises:

a block floating point encoder applied to the signal samples to produce the compressed samples.

21. The apparatus of claim 19, wherein the compressor further comprises:

a difference operator that calculates first or higher order differences of the signal samples to form a sequence of difference samples in accordance with the compression control parameter; and an encoder applied to the difference samples to produce the compressed samples.

22. The apparatus of claim 21, wherein the encoder further comprises:

a block floating point encoder applied to the difference samples to produce the compressed samples.

23. The apparatus of claim 19, wherein the compression control parameter is based on one or more characteristics of the signal samples.

24. The apparatus of claim 23, wherein the characteristic includes at least one of a sample rate, a sample width, a bandwidth and a modulation type of the signal samples.

25. The apparatus of claim 19, wherein the plurality of compressors is implemented in a programmable processor, a field programmable gate array (FPGA) or an application specific integrated circuit (ASIC) in a compression subsystem of the baseband processor.

26. The apparatus of claim 19, wherein the base transceiver system is compatible with one of the following industry standards:

an Open Base Station Architecture Initiative (OBSAI) standard; and a Common Public Radio Interface (CPRI) standard.

27. The apparatus of claim 19, wherein the formatter further comprises:

a plurality of mappers, each mapper receiving a sequence of the compressed samples from a corresponding compressor and mapping the sequence of the compressed samples to a sequence of data structures, the plurality of mappers producing a plurality of sequences of data structures corresponding to the plurality of baseband antenna-carrier channels; and a multiplexer that combines the plurality of sequences of data structures to form a sequence of multiplexed data structures representing the compressed samples of the plurality of baseband antenna-carrier channels, wherein the multiplexer provides the sequence of multiplexed data structures to the serial data link.

28. The apparatus of claim 27, wherein the mapper further comprises:
an Ethernet frame mapper that maps the sequence of the compressed samples to a sequence of Ethernet MAC frames; and
a second mapper that maps the sequence of Ethernet MAC frames to the sequence of data structures.

29. The apparatus of claim 27, wherein the data structures are formed in accordance with one of the following:
an Open Base Station Architecture Initiative (OBSAI) standard, wherein the data structures are formed in accordance with a Reference Point 3 (RP3) message protocol; and
a Common Public Radio Interface (CPRI) standard wherein the data structures are formed in accordance with an antenna-carrier (AxC) container protocol.

30. The apparatus of claim 20, wherein the decompressor further comprises:
a block floating point decoder applied to the compressed samples to produce the decompressed signal samples.

31. The apparatus of claim 21, wherein the decompressor further comprises:
a decoder applied to the compressed samples to produce decoded difference samples; and
an integration operator applied to the decoded difference samples to form the decompressed signal samples.

32. The apparatus of claim 31, wherein the decoder further comprises a block floating point decoder applied to the compressed samples.

33. The apparatus of claim 19, wherein the decompressor is implemented in a field programmable gate array (FPGA), an application specific integrated circuit (ASIC) or a programmable processor in a decompression subsystem of the RF unit.

34. The apparatus of claim 27, wherein the RF unit further comprises:

a demultiplexer that receives the sequence of multiplexed data structures representing the compressed samples and reconstructs the plurality of sequences of data structures corresponding to the plurality of baseband antenna-carrier channels; and
a plurality of demappers, each demapper receiving a corresponding sequence of data structures from the demultiplexer and extracting the sequence of the compressed samples of the corresponding baseband antenna-carrier channel, wherein the plurality of demappers provides the plurality of sequences of the compressed samples to the plurality of decompressors.

35. The apparatus of claim 28, further comprising:
a demultiplexer that receives the sequence of multiplexed data structures representing the compressed samples and reconstructs the plurality of sequences of data structures corresponding to plurality of baseband antenna-carrier channels;
a plurality of Ethernet frame demappers, each Ethernet frame demapper receiving a corresponding sequence of data structures from the demultiplexer and reconstructing the sequence of Ethernet MAC frames of the corresponding baseband antenna-carrier channel; and
a plurality of demappers, each demapper receiving the corresponding sequence of Ethernet MAC frames and extracting the sequence of the compressed samples of the corresponding baseband antenna-carrier channel, wherein the plurality of demappers provides the plurality of sequences of the compressed samples to the plurality of decompressors.

36. The apparatus of claim 19, wherein a first serial data link couples the baseband processor to an intermediate hub, the intermediate hub being coupled by a second serial data link to another hub or to the RF unit, wherein the intermediate hub transfers the compressed samples from the first serial data link to the second serial data link.

37. The apparatus of claim 19, wherein the base transceiver system includes a plurality of the RF units coupled to communicate via a plurality of serial data links with the baseband processor to form a distributed antenna system, each RF unit including the plurality of decompressors to decompress corresponding compressed samples received from the baseband processor and providing the corresponding decompressed signal samples to the DUC for forming the upconverted digital signal.

* * * * *

UNITED STATES PATENT AND TRADEMARK OFFICE
CERTIFICATE OF CORRECTION

PATENT NO. : 8,005,152 B2
APPLICATION NO. : 12/124382
DATED : August 23, 2011
INVENTOR(S) : Albert W. Wegener Page 1 of 1

It is certified that error appears in the above-identified patent and that said Letters Patent is hereby corrected as shown below:

In Drawing Sheet 8 of 18, in Figure 5, in block 530, delete the word "Messsage" and insert the word
-- Message --

In Drawing Sheet 9 of 18, in Figure 6, delete the word "Messsage" and insert the word
-- Message --

In claim 18, column 23, line 33, after the word "plurality" insert the word -- of --

Signed and Sealed this
Sixth Day of December, 2011

David J. Kappos
*Director of the United States Patent and Trademark Office*